United States Patent
Tanaka

(10) Patent No.: US 10,666,013 B2
(45) Date of Patent: May 26, 2020

(54) DRIVER CIRCUIT

(71) Applicant: SUMITOMO ELECTRIC INDUSTRIES, LTD., Osaka (JP)

(72) Inventor: Keiji Tanaka, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 26 days.

(21) Appl. No.: 15/992,810

(22) Filed: May 30, 2018

(65) Prior Publication Data

US 2018/0351325 A1 Dec. 6, 2018

(30) Foreign Application Priority Data

Jun. 5, 2017 (JP) .................................. 2017-110985
Jun. 5, 2017 (JP) .................................. 2017-110986

(51) Int. Cl.
*H01S 5/042* (2006.01)
*H04B 10/50* (2013.01)
*H01S 5/062* (2006.01)

(52) U.S. Cl.
CPC ............ *H01S 5/042* (2013.01); *H01S 5/0427* (2013.01); *H04B 10/504* (2013.01);
(Continued)

(58) Field of Classification Search
CPC .... H01S 5/0427; H01S 5/06226; H01S 5/042; H04B 10/501
(Continued)

(56) References Cited

U.S. PATENT DOCUMENTS 7,147,387 B2 12/2006 Aronson et al.
7,453,306 B2 11/2008 Baumgartner et al.
(Continued)

FOREIGN PATENT DOCUMENTS

JP 60-187075 9/1985
JP 2-65188 3/1990
(Continued)

OTHER PUBLICATIONS

Yasuharu Suematsu, and Tchang-Hee Hong, "Suppression of Relaxation Oscillation in Light Output of Injection Lasers by Electrical Resonance Circuit", *IEEE Journal of Quantum Electronics*, vol. QE-13, No. 9, p. 756-p. 762, Sep. 1977.
(Continued)

*Primary Examiner* — Tuan N Nguyen
(74) *Attorney, Agent, or Firm* — Smith, Gambrell & Russell, LLP.

(57) ABSTRACT

A driver circuit configured to increase or decrease a drive current flowing to a light emitting element in accordance with an input signal, the driver circuit including: an output terminal configured to be electrically connected between a bias current source and the light emitting element, and configured to draw an output current inward; a shunt circuit configured to generate a first current in accordance with the input signal; and a waveform shaping circuit configured to detect a rising transition of a voltage of the output terminal and generate a second current based at least in part on a result of detection, wherein the first current and the second current constitute the output current, Wherein the first current increases when the input signal increases, and decreases when the input signal decreases, and wherein the voltage of the output terminal rises when the output current decreases.

12 Claims, 17 Drawing Sheets

(52) U.S. Cl.
 CPC ....... *H01S 5/06213* (2013.01); *H01S 5/06226* (2013.01); *H04B 10/501* (2013.01)

(58) Field of Classification Search
 USPC .......................................... 372/38.02; 363/58
 See application file for complete search history.

(56) References Cited

U.S. PATENT DOCUMENTS

| | | | | |
|---|---|---|---|---|
| 2006/0187983 | A1* | 8/2006 | Baba | ..................... H01S 5/0427 |
| | | | | 372/38.07 |
| 2009/0268767 | A1* | 10/2009 | Nelson | ..................... H01S 5/042 |
| | | | | 372/38.02 |
| 2011/0175587 | A1* | 7/2011 | Hosotani | ........... H02M 3/33515 |
| | | | | 323/283 |
| 2014/0240052 | A1* | 8/2014 | Mao | ..................... H03F 1/0222 |
| | | | | 330/302 |

FOREIGN PATENT DOCUMENTS

| | | |
|---|---|---|
| JP | 4-290278 | 10/1992 |
| JP | 2007-324463 | 12/2007 |
| JP | 2013-239641 | 11/2013 |
| JP | 2016-96221 | 5/2016 |

OTHER PUBLICATIONS

Akihiro Moto, et al., "A Low Power Quad 25.78-Gbit/s 2.5V Laser Diode Driver using Shunt-Driving in 0.18 μm SiGe-BiCMOS", *IEEE Compound Semiconductor Integrated Circuit Symposium*, 2013.

\* cited by examiner

DRIVER CIRCUIT

TECHNICAL FIELD

One aspect of the present invention relates to a driver circuit.

BACKGROUND

A direct modulation system of modulating an optical signal output from a light emitting element (for example, a laser diode) by increasing or decreasing a current flowing to the light emitting element has been used in optical communication systems. Japanese Unexamined Patent Publication No. S60-187075 describes a driver circuit that includes a field effect transistor (FET) to which an input signal is input and a laser diode connected in series to a drain of the FET. A series circuit including a resistor and a capacitor is connected in parallel with the laser diode. Japanese Unexamined Patent Publication No. H2-65188 describes a driver circuit that includes a source-grounded FET and a laser diode connected to a drain of the FET via a resistor. A series circuit including a variable capacitance diode and a capacitor is connected in parallel with the resistor. U.S. Patent Application Publication No. 2006/0159462 describes a driver circuit of a laser diode which generates a driving signal having emphasized transitions. The transitions are emphasized by adding a positive pulse to an input pulse at a rising transition thereof and subtracting a negative pulse from the input pulse at a falling transition. The positive pulse and the negative pulse have amplitude reduced from that of the input pulse. A reference voltage of the positive pulse and the negative pulse corresponds to an average voltage of the input pulse. The positive and negative pulses are generated by calculating an exclusive OR of the input signal and a delayed signal delayed from the input signal. Japanese Unexamined Patent Publication No. 2016-96221 describes a shunt driver circuit connected in parallel with a laser diode to which a bias current is supplied. The shunt driver circuit causes a shunt current bypassed from the bias current so as to increase or decrease a laser current.

In the case of driving the laser diode by the direct modulation system, relaxation oscillation appears depending on a transition between oscillation states of light emission and extinction of the laser diode. The relaxation oscillation causes overshoot and undershoot in an optical output waveform. Such waveform disturbances degrade an eye opening of an optical signal, and thus, need to be suppressed. Japanese Unexamined Patent Publication No. H4-290278, Japanese Unexamined Patent Publication No. 2007-324463, and Japanese Unexamined Patent Publication No. 2013-239641 describe a driver circuit loaded with an RC series circuit including a resistive element and a capacitor or an RLC series circuit further including an inductor in order to suppress a disturbance of a waveform.

In the case of electrically connecting a driver circuit formed on a semiconductor chip to a semiconductor laser element by wire bonding, an inductance of a bonding wire prevents transition speed of a drive current from being enhanced. The inductance can be reduced by shortening a length of the bonding wire. However, heat is more easily transmitted through a more shortened bonding wire, and thus, cooling efficiency is degraded in the case of controlling temperature of the semiconductor laser element with a thermo-electric cooler (TEC) or the like. Therefore, a driver circuit hardly affected by the inductance is required in order to improve high speed performance of an optical communication system.

SUMMARY

A driver circuit according to an aspect of the invention is a driver circuit configured to increase or decrease a drive current flowing to a light emitting element connected in series to a bias current source that supplies a bias current, in accordance with an input signal. The driver circuit includes: an output terminal configured to be electrically connected between the bias current source and the light emitting element, and configured to draw an output current inward; a shunt circuit configured to generate a first current in accordance with the input signal; and a waveform shaping circuit configured to detect a rising transition of a voltage of the output terminal and generate a second current based at least in part on a result of detection. The first current and the second current constitute the output current. The first current increases when the input signal increases, and decreases when the input signal decreases. The voltage of the output terminal rises when the output current decreases.

A driver circuit configured to increase or decrease a drive current flowing to a light emitting element connected in series to a bias current source that supplies a bias current, in accordance with an input signal. The driver circuit includes: an input terminal to which the input signal is input; an output terminal configured to be electrically connected between the bias current source and an anode of the light emitting element; a common emitter amplifier configured to increase or decrease the drive current by generating an output current in accordance with the input signal and drawing the output current from the bias current via the output terminal; and a level shift circuit configured to be electrically connected to a cathode of the light emitting element and configured to increase a potential of the cathode above a ground potential. The common emitter amplifier includes: a resistive element; a first transistor including a control terminal electrically connected to the input terminal, a first current terminal, and a second current terminal electrically connected to the ground potential via the resistive element; and a second transistor including a control terminal to which a constant voltage is applied, a first current terminal electrically connected to the output terminal, and a second current terminal electrically connected to the first current terminal of the first transistor.

DETAILED DESCRIPTION

Specific examples of a driver circuit according to embodiments of the present invention will be described hereinafter with reference to the drawings. In the description of the drawings, the same or corresponding elements will be denoted by the same reference signs, and duplicate descriptions will be appropriately omitted. Note that the present invention is not limited to these exemplifications and is determined by the claims, and all changes that fall within the meanings and scope of equivalence of the claims therefore are intended to be embraced therein.

First Embodiment

Figure 1:
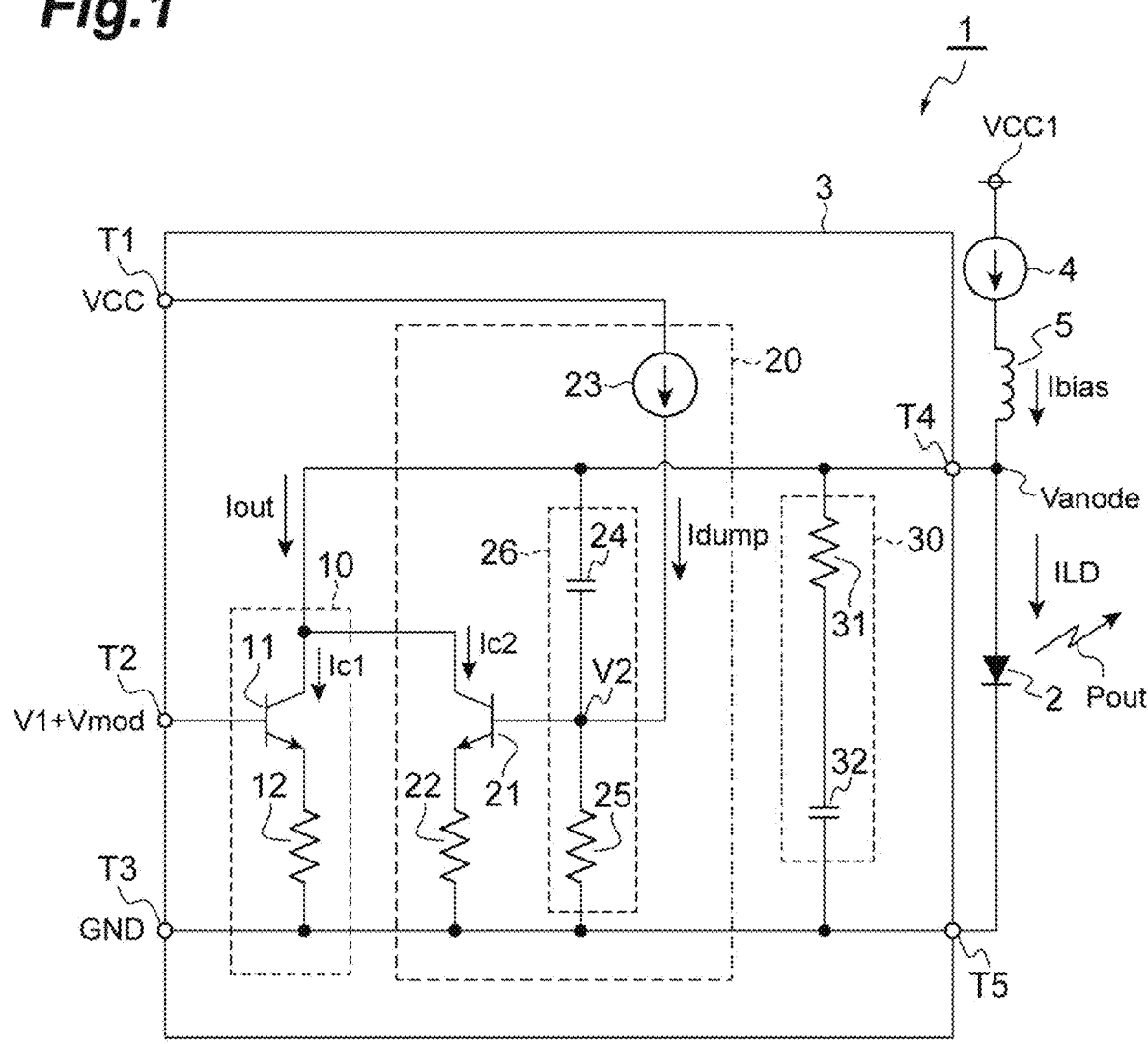
FIG. 1 is a diagram illustrating a schematic configuration of an optical transmitter including a driver circuit according to a first embodiment.

FIG. 1 is a diagram illustrating a schematic configuration of an optical transmitter including a driver circuit according to a first embodiment. As illustrated in FIG. 1, an optical transmitter 1 mainly includes a light emitting element 2 and a driver circuit 3. The light emitting element 2 is, for example, a semiconductor laser element for direct modulation, and specifically, an edge-emitting semiconductor laser diode. Examples of such laser diodes include a distributed feedback laser diode (DFB-LD), a Fabry-Perot laser diode (FP-LD), and the like.

In the light emitting element 2, carriers (electrons and holes) are generated when a drive current ILD is injected into an active layer. Photons are generated by recombination of the carriers, but a delay occurs until then. Thus, even if an increase of the drive current ILD is stopped, for example, while the carriers generated by the drive current ILD increase (that is, when an optical output signal Pout rises), excessively generated carriers are still consumed as photons and the delay causes an overshoot in the optical output signal Pout. Further, as carriers are excessively consumed due to the overshoot, the photons generated by recombination of the carriers also decrease. As the carriers become momentarily insufficient than a stable point (1-level), an undershoot appears in the optical output signal Pout. In this manner, relaxation oscillation is caused by alternately repeating the overshoot and undershoot while attenuating each degree thereof to approach a steady value.

Figure 2A:
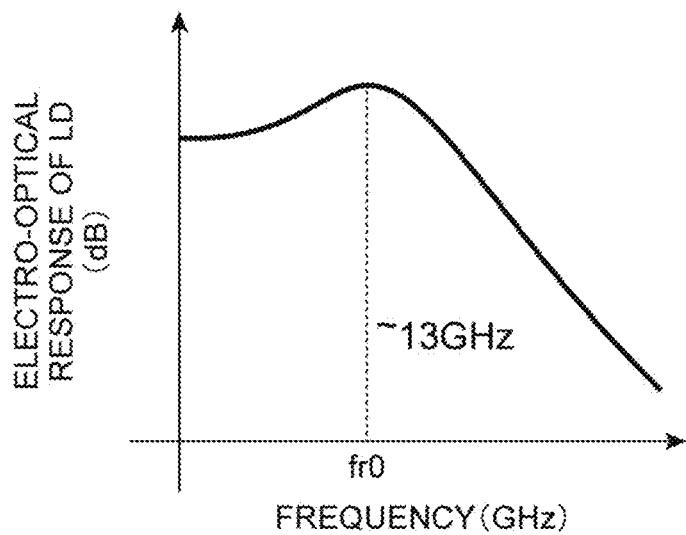
FIG. 2A is a graph illustrating an example of an electro-optical response of a light emitting element at a 0-level drive current.
Figure 2B:
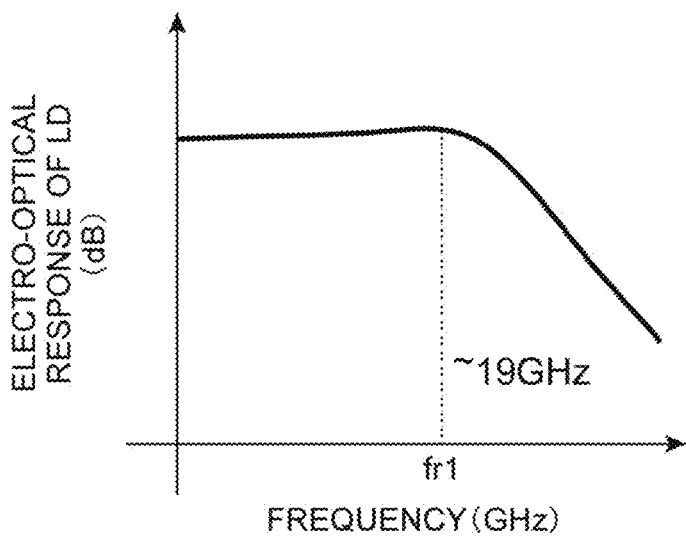
FIG. 2B is a graph illustrating an example of the electro-optical response of the light emitting element at a 1-level drive current.

FIG. 2A is a graph illustrating an example of an electro-optical response (E/O response) of the light emitting element 2 at the drive current ILD of a level 0, and FIG. 2B is a graph illustrating an example of the electro-optical response of the light emitting element 2 at the drive current ILD of a level 1. As illustrated in FIG. 2A, a relaxation oscillation frequency fr0 at the 0-level drive current ILD is, for example, about 13 GHz. As illustrated in FIG. 2B, a relaxation oscillation frequency fr1 at the 1-level drive current ILD is, for example, about 19 GHz. A value of the relaxation oscillation frequency depends on materials constituting the semiconductor laser element and a structure of the element. In addition, the value also varies among individuals. The level 0 corresponds to a state where the drive current is as small as a threshold current for laser oscillation and power of an optical signal output from the laser diode is small, that is, a light extinction state. The level 1 corresponds to a state where the drive current is sufficiently larger than the threshold current and the power of the optical signal output from the laser diode is relatively high, that is, a light emission state.

As illustrated in FIGS. 2A and 2B, a relaxation oscillation frequency is relatively low at the level 0 because the drive current is smaller than that at the level 1. Contrarily, the relaxation oscillation frequency is relatively high at the level 1. These relaxation oscillation frequencies are derived from a rate equation and correspond to a resonance frequency of modulation sensitivity of a light output in response to a current input. The oscillation (overshoot and undershoot) occurs in the optical output waveform in accordance with this resonance frequency. The rate equation is a basic formula that describes operational characteristics of the light emitting element 2.

When the relaxation oscillation frequency is lower than a transmission rate of an optical output signal, two cases are possible: one case is that next transition of the optical output signal occurs before the relaxation oscillation caused by a previous transition converges, another case is that the next transition of the optical output signal occurs after the relaxation oscillation caused by the previous transition converges. As a result, the relaxation oscillation prevents a start position (timing) of a rise or a fall of the optical output signal from matching a predetermined preferable position (timing). Such mismatch causes intersymbol interference (ISI), which degrades eye opening of the optical output signal. The ISI can be suppressed by slowing the transition speed of the drive current flowing to the laser diode, but the slowed transition makes it difficult to obtain a sufficient eye opening. On the other hand, when the transition speed of the drive current is made faster, the overshoot and undershoot become worse and cause jitters to increase, and thus, it is difficult to obtain a sufficient eye opening of the optical output signal due to the ISI.

In particular, a fundamental frequency of a transmission rate of 25.78125 Gbit/s of the Ethernet standard standardized by the institute of electrical and electronic engineers (IEEE) is 12.89 GHz, and a fundamental frequency of a transmission rate of 27.95 Gbit/s of an optical-channel transport unit (OTU) 4 standard standardized by the international telecommunication union (ITU) is 13.975 GHz.

In particular, the relaxation oscillation frequency fr1 at the level 1 illustrated in FIG. 2B is 19 GHz, which is higher than the above-described fundamental frequency of the transmission rate and is relatively largely shifted. Thus, the overshoot is likely to occur near the center of the eye opening in a waveform of the optical output signal Pout, and the oscillation does not converge immediately, so that the influence on a next bit (signal transition) increases. For example, the eye opening deteriorates as the jitters increase.

On the other hand, the relaxation oscillation frequency fr0 at the level 0 illustrated in FIG. 2A is a value relatively close to the above-described fundamental frequency of the transmission rate. Thus, the undershoot is smaller than the overshoot at the level 1, and an oscillation period thereof is also close to a bit period. Accordingly, the undershoot is not positioned at the center of the eye opening, and the oscillation rapidly converges. As a result, the influence on the waveform after the waveform of the optical output signal Pout rises from the level 0 to the level 1 in the next bit becomes relatively small. For example, if the transition speed of the drive current at the rising transition from the level 0 to the level 1 (rising transition) is slowed, it is possible to expect to reduce the overshoot. As a result, however, the transition speed of the drive current at the time of transition from the level 1 to the level 0 (falling transition) is also slowed so that there is a risk that it is difficult to obtain the sufficient eye opening. Therefore, it is preferable to delay the transition speed of the drive current only for the transition from the level 0 to the level 1 (rising transition).

Referring back to FIG. 1, an anode of the light emitting element 2 is connected to a supply line VCC1 via a ferrite bead inductor (FBI) 5 and a bias current source 4. That is, the light emitting element 2 is connected in series to the bias current source 4. Further, the anode of the light emitting element 2 is connected to a terminal T4 of the driver circuit 3. A cathode of the light emitting element 2 is connected to a terminal T5 of the driver circuit 3 and is connected to a ground potential GND (ground point) via a ground line of the driver circuit 3. That is, the light emitting element 2 operates with the grounded cathode. The bias current source 4 supplies a direct-current (DC) bias current Ibias in order to cause the light emitting element 2 to emit light with predetermined power.

The driver circuit 3 is a driver circuit of a direct modulation system, and is a circuit configured to increase or decrease the drive current ILD of the light emitting element 2 based on a shunt driving system. The driver circuit 3 is, for example, a diver circuit of a direct modulation system that can be used at a high transmission rate of 25 Gbit/s or higher. The driver circuit 3 directly modulates, for example, the light emitting element 2 by on-off keying. That is, the driver circuit 3 increases or decreases the drive current ILD in accordance with an input signal Vmod, thereby increasing or decreasing the optical output signal Pout.

The driver circuit 3 has a terminal T1, a terminal T2, a terminal T3, the terminal T4, and the terminal T5. The terminal T1 is electrically connected to a supply line VCC. The input signal Vmod is supplied to the terminal T2 from the outside. The terminal T3 is electrically connected to the ground potential GND. The terminal T4 is electrically connected to the anode of the light emitting element 2. The terminal T5 is connected to the cathode of the light emitting element 2. The terminals T3 and T5 are electrically connected to each other via a ground line inside the driver circuit 3. That is, the terminal T5 is electrically connected to the ground potential GND.

The driver circuit 3 generates an output current Iout in accordance with the input signal Vmod supplied to the terminal T2. The output current Iout is a signal for increasing or decreasing the drive current ILD, and is subtracted (bypassed) from the bias current Ibias via the terminal T4 and is sank into the driver circuit 3. As a result, the drive current ILD becomes a current obtained by combining the bias current Ibias and the output current Iout. That is, since the drive current ILD is a current obtained by subtracting the output current Iout from the bias current Ibias, a waveform of the drive current ILD has a shape obtained by vertically inverting a waveform of the output current Iout. Therefore, the waveform of the optical output signal Pout becomes the level 1 when the waveform of the output current Iout becomes the level 0, and the optical output signal Pout becomes the level 0 when the waveform of the output current Iout becomes the level 1.

With such a configuration, the drive current ILD defined by the bias current source 4 and the driver circuit 3 is supplied to the light emitting element 2 through the anode of the light emitting element 2, and the light emitting element 2 outputs the optical output signal Pout in accordance with the drive current ILD. When the light emitting element 2 outputs the optical output signal Pout at the level 1, an anode potential Vanode at the level 1 is applied to the anode of the light emitting element 2. When the light emitting element 2 outputs the optical output signal Pout at the level 0, the anode potential Vanode at the level 0 is applied to the anode of the light emitting element 2. Incidentally, the anode potential Vanode is a potential of the anode of the light emitting element 2.

The configuration of the driver circuit 3 will be described in more detail. The driver circuit 3 includes a shunt circuit 10, a waveform shaping circuit 20, and a filter circuit 30 (second filter circuit).

The shunt circuit 10 is a circuit that generates a first current Ic1 in accordance with the input signal Vmod. The shunt circuit 10 decreases the drive current ILD by subtracting (bypassing) the main current (first current) Ic1 as the output current Iout from the bias current Ibias. Note that the first current Ic1 becomes equal to the output current Iout, when the waveform shaping circuit 20 does not generate an additional current for the output current Iout. The waveform shaping circuit 20 will be described later. Further, when the output current Iout is decreased, the current to be subtracted from the bias current Ibias is decreased, so that the drive current ILD is increased. The shunt circuit 10 includes a transistor 11 (second transistor) and a resistive element 12.

The transistor 11 is, for example, an NPN bipolar transistor. A base of the transistor 11 is electrically connected to the terminal T2 of the driver circuit 3. An emitter of the transistor 11 is electrically connected to the ground potential GND via the resistive element 12 and the terminal T3. That is, the shunt circuit 10 is a common emitter amplifier (second common emitter amplifier). A collector of the transistor 11 is electrically connected to the terminal T4 of the driver circuit 3 and is electrically connected to the anode of the light emitting element 2 via the terminal T4. The collector of the transistor 11 is electrically connected to the bias current source 4 via the terminal T4 and the FBI 5. That is, the collector of the transistor 11 serves as an output portion of the shunt circuit 10. A gain of the common emitter amplifier of the shunt circuit 10 is determined based on a resistance value R1 of the resistive element 12.

A bias voltage V1, necessary for causing the transistor 11 to operate in Class A mode, is supplied to the base of the transistor 11 from the outside via the terminal T2. That is, the bias voltage V1 is superimposed on the input signal Vmod. When the input signal Vmod and the bias voltage V1 are input to the base of the transistor 11 in the shunt circuit 10 having such a configuration, a collector current (output current Iout) having a current value corresponding to a voltage level of the input signal Vmod is sank (output) to the collector of the transistor 11. For example, when the input signal Vmod increases with respect to the bias voltage V1 set to a constant value, the magnitude of the output current Iout increases. When the input signal Vmod decreases, the magnitude of the output current Iout decreases.

The waveform shaping circuit 20 is a circuit configured to shape the waveform of the output current Iout. Specifically, the waveform shaping circuit 20 increases a falling time of the output current Iout by reducing high-frequency components of the output current Iout. The falling time of the waveform is a transition time for transition from the level 1 to the level 0 (falling transition). For example, the falling time is measured as a time for a decrease from 80% to 20% of magnitude, for example, when a value (peak value) of the level 1 is taken as a reference (100%). The waveform shaping circuit 20 is connected in parallel with the light emitting element 2 via the terminal T4. The waveform shaping circuit 20 generates an additional current (second current) Ic2. The second current Ic2 is added to the first current Ic1 to increase the output current Iout. That is, a sum of the first current Ic1 and the second current Ic2 becomes equal to the output current Iout, when the waveform shaping circuit 20 generates the second current Ic2. The waveform shaping circuit 20 includes, for example, a transistor 21 (first transistor), a resistive element 22, a current source 23, a capacitor 24, and a resistive element 25.

The transistor 21 is, for example, an NPN bipolar transistor. A base (control terminal) of the transistor 21 is electrically connected to the ground potential GND via the resistive element 25 and the terminal T3. The base of the transistor 21 is electrically connected to the terminal T4 via the capacitor 24. An emitter of the transistor 21 is electrically connected to the ground potential GND via the resistive element 22 and the terminal T3. That is, the waveform shaping circuit 20 is a common emitter amplifier (first common emitter amplifier). A collector (first current terminal) of the transistor 21 is electrically connected to the output portion (the collector of the transistor 11) of the shunt circuit 10.

One end of the resistive element 22 is electrically connected to the emitter of the transistor 21, and the other end of the resistive element 22 is electrically connected to the terminal T3 and the terminal T5 via a ground line. A gain of the common emitter amplifier of the waveform shaping circuit 20 is determined based on a resistance value R2 of the resistive element 22. The resistance value R2 is larger than the resistance value R1 and is, for example, about ten times the resistance value R1. The gain of the common emitter amplifier of the waveform shaping circuit 20 is lower than the gain of the common emitter amplifier of the shunt circuit 10, and is, for example, about one tenth of the gain of the common emitter amplifier of the shunt circuit 10. Thereby, magnitude of the second current Ic2 is adjusted to be smaller than magnitude of the first current Ic1.

The current source 23 is a current source for voltage setting configured to supply a constant current Idump to the resistive element 25. One end of the current source 23 is electrically connected to the terminal T1 and is connected to the supply line VCC via the terminal T1. The other end of the current source 23 is electrically connected to the ground potential GND via the resistive element 25 and the terminal T3. The other end of the current source 23 is further electrically connected to the base of the transistor 21. The current source 23 supplies the constant current Idump to the resistive element 25 so as to generate a potential V2 using the ground potential GND as a reference at the base of the transistor 21. The potential V2 is expressed by Idump×R3 using a resistance value R3 of the resistive element 25. The potential V2 is determined based on a current value of the constant current Idump and the current value of the constant current Idump is set to such a magnitude that the transistor 21 is caused to operate in Class C amplifier.

One end of the capacitor 24 is electrically connected to the output portion (the collector of the transistor 11) of the shunt circuit 10 and the terminal T4, and the other end of the capacitor 24 is electrically connected to the base of the transistor 21 and one end of the resistive element 25. That is, the capacitor 24 is provided between the output portion of the shunt circuit 10 and the base of the transistor 21. One end of the resistive element 25 is electrically connected to the base of the transistor 21, the other end of the capacitor 24, and the other end of the current source 23. The other end of the resistive element 25 is electrically connected to the terminal T3 and the terminal T5 via the ground line. That is, the resistive element 25 is provided between the base of the transistor 21 and the ground potential GND. A filter circuit 26 (first filter circuit) is constituted by the capacitor 24 and the resistive element 25. The filter circuit 26 is a high-pass filter, and a frequency range of the high-frequency components of the output current Iout to be reduced by the waveform shaping circuit 20 (the falling time thereof is adjusted) is set based on a capacitance value Cs of the capacitor 24 and the resistance value R3 of the resistive element 25.

In the waveform shaping circuit 20 configured as described above, only the high-frequency components of the anode potential Vanode caused by modulation of the light emitting element 2 is detected by the capacitor 24, and accordingly, a base voltage of the transistor 21 is modulated.

As a result, only when the anode potential Vanode rises (the optical output signal Pout rises), the transistor 21 performs a negative feedback operation with respect to the input signal Vmod. Further, frequency components to be fed back is adjusted by the filter circuit 26. The transistor 21 generates the second current Ic2 in response to the high-frequency components of the anode potential Vanode at the rising transition thereof (that is, at the falling transition of the output current Iout).

The filter circuit 30 is a circuit configured to adjust the transition time of the drive current ILD flowing to the light emitting element 2 by bypassing a part of the high-frequency components of the drive current ILD. The filter circuit 30 includes a resistive element 31 and a capacitor 32. The resistive element 31 and the capacitor 32 are connected in series between the terminal T4 and the terminal T5 of the driver circuit 3. That is, the filter circuit 30 is electrically connected between the anode and the cathode of the light emitting element 2, and is connected in parallel with the light emitting element 2. The filter circuit 30 acts substantially at the same level for both the rising transition and falling transition of the anode potential Vanode.

In the driver circuit 3 having such a configuration, the output current Iout generated in accordance with the input signal Vmod is shunted from the bias current Ibias, so that the drive current ILD flowing to the light emitting element 2 is increased or decreased. Thus, the output current Iout and the optical output signal Pout output from the light emitting element 2 are logically inverted to each other. When the light emitting element 2 outputs the optical output signal Pout at the level 1 (light emission state), the anode potential Vanode at the level 1 is applied to the light emitting element 2. When the light emitting element 2 outputs the optical output signal Pout at the level 0 (light distinction state), the anode potential Vanode at the level 0 is applied to the light emitting element 2. The optical output signal Pout at the level 1 is greater than the optical output signal Pout at the level 0. The anode potential Vanode at the level 1 is higher than the anode potential Vanode at the level 0. Since the filter circuit 26 having the capacitor 24 and the resistive element 25 is provided at the output portion of the shunt circuit 10, the high-frequency components of the anode potential Vanode to be applied to the light emitting element 2 is extracted and applied to the base of the transistor 21 at the transition of driving the light emitting element 2.

Thus, when the optical output signal Pout rises from the level 0 to the level 1, the transistor 21 operates (performs the negative feedback operation). As described above, the output current Iout and the optical output signal Pout are logically inverted to each other. The negative feedback operation allows the transistor 21 to increase the current amount of the output current Iout when the output current Iout falls (decreases). As a result, the falling time of the output current Iout is lengthened. In other words, the falling transition of the output current Iout is slowed. When the output current Iout decreases, the anode potential Vanode of the light emitting element 2 electrically connected to the shunt circuit 10 via the terminal T4 increases. Since the falling transition of the output current Iout is slowed by the negative feedback operation of the transistor 21, the rising transition of the anode potential Vanode is slowed. That is, the lengthened transition time (rising time) in which the optical output signal Pout rises from the level 0 to the level 1 mitigates the above-described overshoot when the optical output signal Pout rises from the level 0 to the level 1. As a result, the degradation of the optical output signal Pout due to the relaxation oscillation at the level 1 of the optical output signal Pout can be reduced. That is, the negative feedback operation to the transistor 21 allows only the rise time of the optical output signal Pout to be lengthened and suppresses the intersymbol interference caused by the overshoot of the optical output signal Pout.

In the waveform shaping circuit 20, the constant current Idump flowing through the resistive element 25 generates the bias voltage (having the potential V2), which is applied to the base of the transistor 21. The bias voltage of the transistor 21 can be adjusted by varying the current amount of the constant current Idump.

When the gain of the common emitter amplifier of the waveform shaping circuit 20 is higher than the gain of the common emitter amplifier of the shunt circuit 10, there is a risk that the falling transition of the output current Iout may be excessively slowed, so that the driving of the light emitting element 2 may be affected. Thus, setting the gain of the common emitter amplifier of the waveform shaping circuit 20 to be lower than the gain of the common emitter amplifier of the shunt circuit 10 allows the negative feedback operation of the common emitter amplifier of the waveform shaping circuit 20 to be limited to an extent that the driving of the light emitting element 2 in accordance with the input signal Vmod is not excessively affected. In other words, magnitude of the second current Ic2 generated by the negative feedback operation is set to be smaller than that of the first current Ic1 generated in response to the input signal Vmod for stability of the negative feedback operation.

A frequency range of the high-frequency components of the output current Iout to be shaped (the falling time thereof is adjusted) by the waveform shaping circuit 20 is set based on the capacitance value Cs of the capacitor 24 and the resistance value R3 of the resistive element 25.

The high-frequency components of the output current Iout are bypassed by the filter circuit 30 connected in parallel with the light emitting element 2. As a result, it is possible to adjust the transition time (or, slope of transition) of the drive current ILD.

Figure 3:
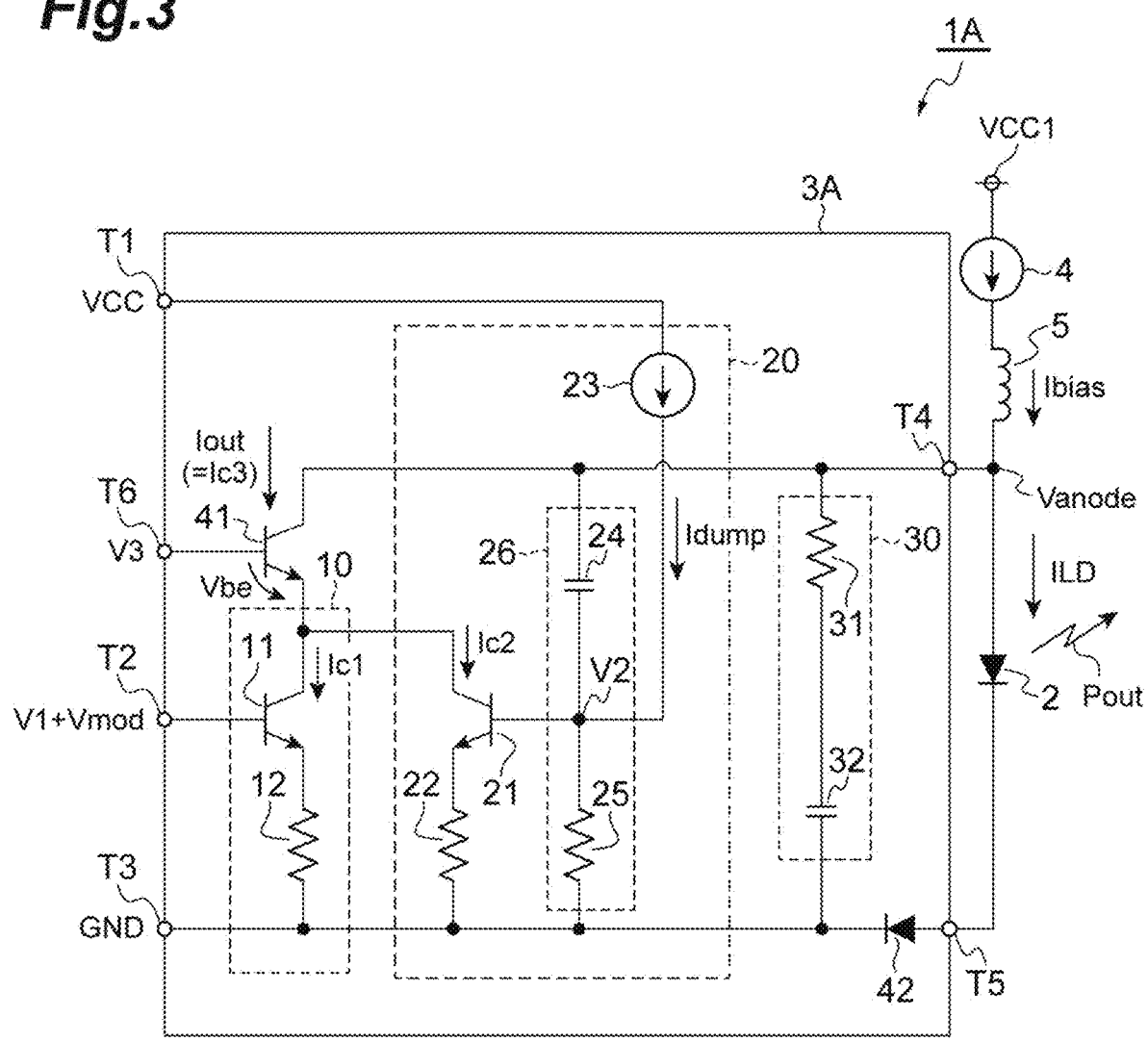
FIG. 3 is a diagram illustrating a schematic configuration of an optical transmitter including a driver circuit according to a modified example of the first embodiment.

Next, a modified example of the driver circuit 3 will be described. FIG. 3 is a diagram illustrating a schematic configuration of an optical transmitter including a driver circuit according to the modified example. As illustrated in FIG. 3, an optical transmitter 1A is mainly different from the optical transmitter 1 in terms that a driver circuit 3A is provided in place of the driver circuit 3. The driver circuit 3A is mainly different from the driver circuit 3 in terms of further including a cascode transistor 41, a diode 42, and a terminal T6.

The diode 42 is a potential adjustment circuit configured to adjust the anode potential Vanode of the light emitting element 2. An anode of the diode 42 is electrically connected to the terminal T5, and a cathode of the diode 42 is electrically connected to the terminal T3 via a ground line of the driver circuit 3A. That is, the diode 42 is connected in series to the light emitting element 2. As a result, the anode potential Vanode is increased by the amount corresponding to a forward voltage (for example, about 0.9 V) of the diode 42 as compared with that in the optical transmitter 1. The diode 42 is provided in order to add the cascode transistor 41.

The cascode transistor 41 is, for example, an NPN bipolar transistor. A base of the cascode transistor 41 is electrically connected to the terminal T6. An emitter of the cascode transistor 41 is electrically connected to the collector of the transistor 11 and the collector of the transistor 21. A collector of the cascode transistor 41 is electrically connected to the terminal T4. That is, the cascode transistor 41 is a cascode transistor provided between the transistor 11 and the capacitor 24.

A bias voltage V3 is supplied to the base of the cascode transistor 41 via the terminal T6. Thus, a voltage (=V3−Vbe) smaller than the bias voltage V3 by a voltage Vbe between the base and the emitter (for example, about 0.9 V) of the cascode transistor 41 is generated at the emitter of the cascode transistor 41. The bias voltage V3 is set such that a voltage between the base and the collector of the transistor 11 is inversely biased. That is, the bias voltage V3 is set to be lower than a collector potential of the cascode transistor 41.

Figure 4:
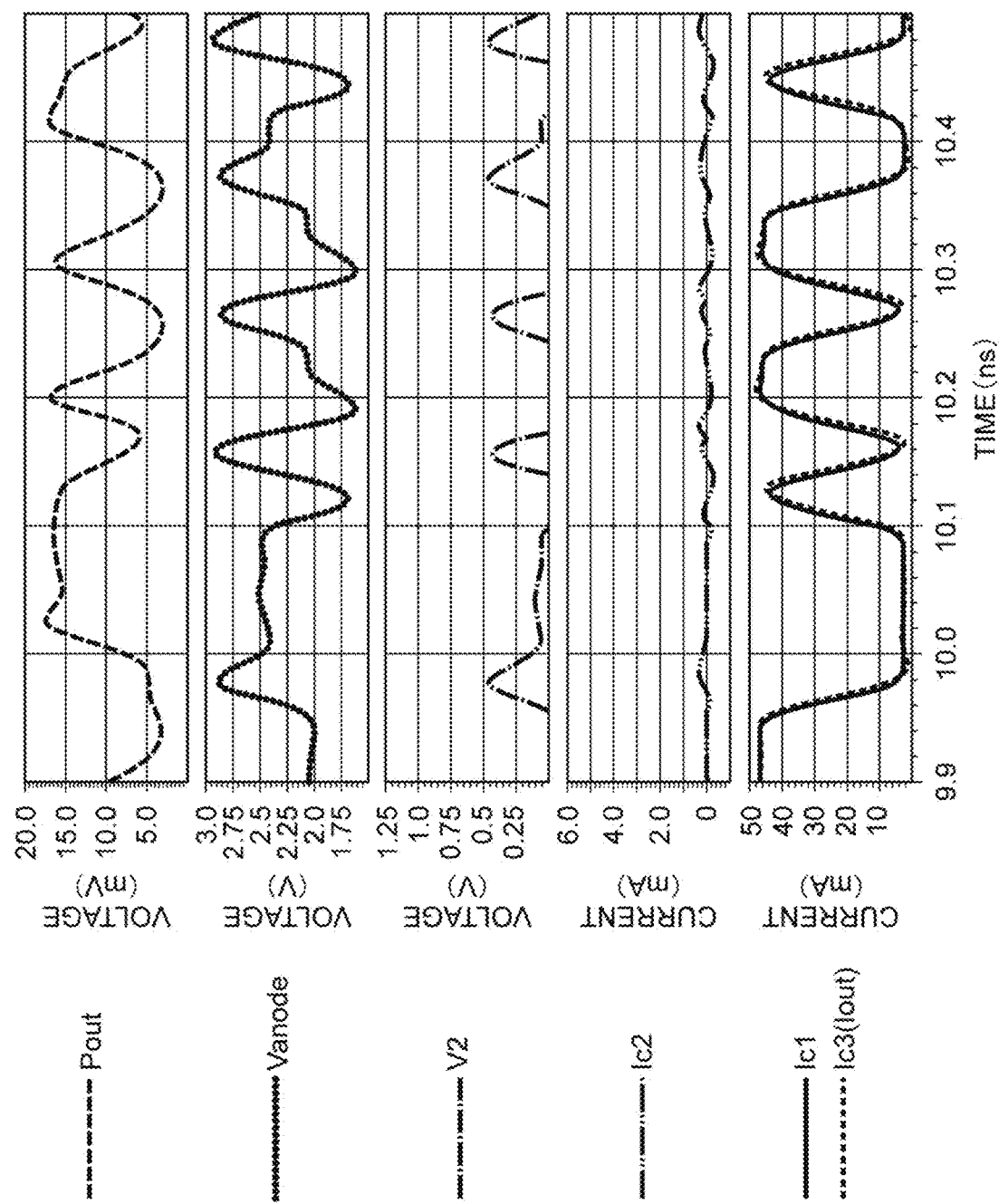
FIG. 4 is a view illustrating a relationship between an operation of the driver circuit and an optical output signal modulated by the driver circuit when a waveform shaping circuit of FIG. 3 is stopped.
Figure 5:
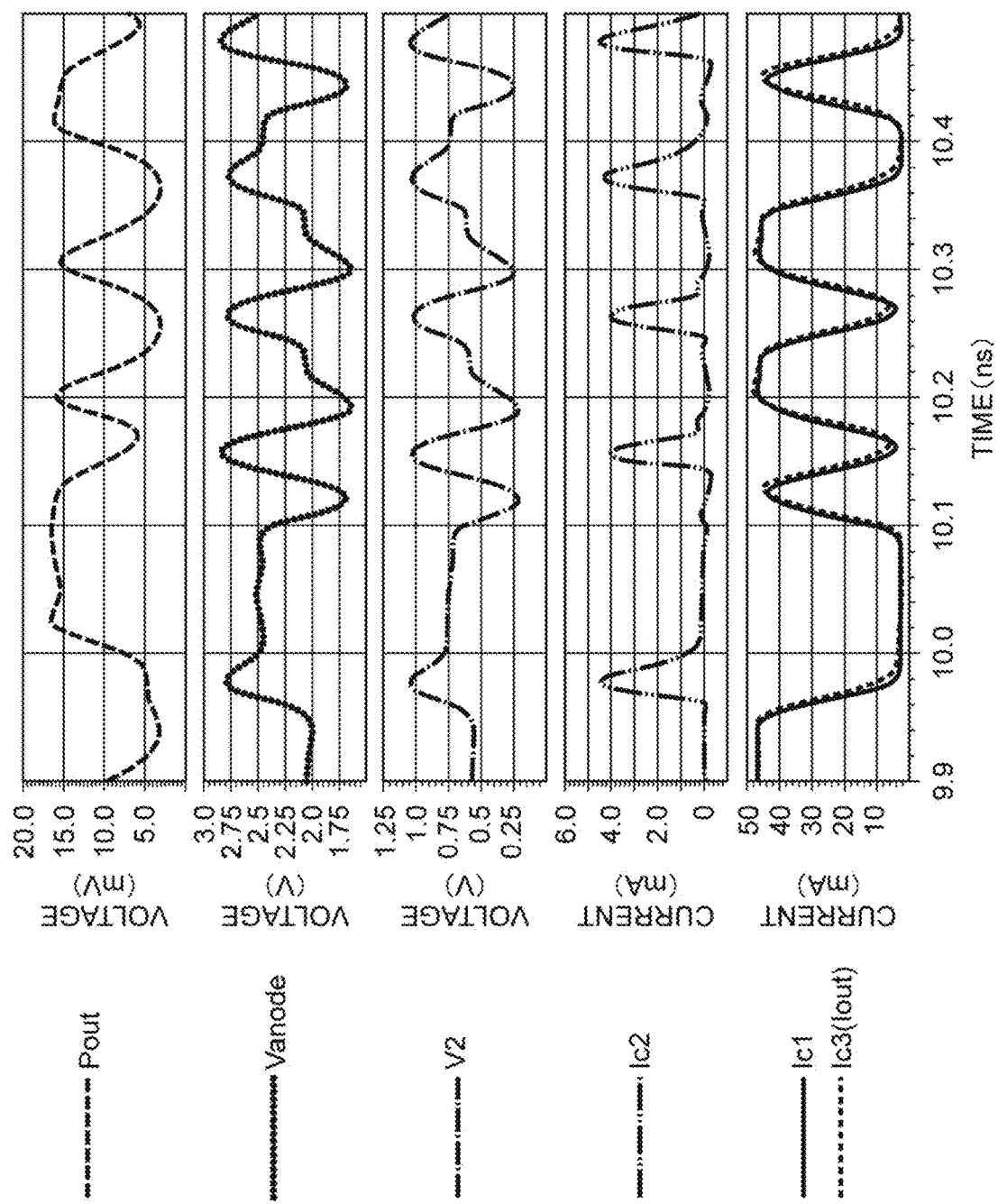
FIG. 5 is a view illustrating a relationship between an operation of the driver circuit and an optical output signal modulated by the driver circuit when a waveform shaping circuit of FIG. 3 is operated.

Next, an operation of the driver circuit 3A will be described further with reference to FIGS. 4 and 5. FIG. 4 is a view illustrating a relationship between an operation of the driver circuit and an optical output signal when a waveform shaping circuit of FIG. 3 is forcibly stopped (or removed). Note that at this time the second current Ic2 is null. FIG. 5 is a view illustrating a relationship between an operation of the driver circuit and an optical output signal when a waveform shaping circuit of FIG. 3 is operated. Note that at this time the second current Ic2 is generated in response to the rising transition of the anode potential Vanode. When the output current Iout decreases, the anode potential Vanode rises. Accordingly, generating the second current Ic2 causes a rate of decreasing the output current Iout to be slowed. Thereby the rising transition of the drive current ILD is slowed. When the potential V2 is forcibly set to 0 V, the waveform shaping circuit 20 is stopped. When the potential V2 is set to 600 mV, for example, the waveform shaping circuit 20 is operated. The optical output signal Pout having larger output power corresponds to the level 1, and optical output signal Pout having smaller output power corresponds to the level 0.

When the waveform shaping circuit 20 is stopped as illustrated in FIG. 4, the light emitting element 2 operates with the common cathode, and thus, the optical output signal Pout increases, when the anode potential Vanode of the light emitting element 2 increases, and the optical output signal Pout decreases, when the anode potential Vanode of the light emitting element 2 decreases. Therefore, a direction of an increase or decrease of the optical output signal Pout is identical to a direction of an increase or decrease of the anode potential Vanode of the light emitting element 2. Although a response time (delay to start laser oscillation) of the optical output signal Pout is about 70 to 80 psec with respect to the anode potential Vanode, the optical output signal Pout and the anode potential Vanode have the same arrangement of the level 1 and the level 0. Only the high-frequency components of the anode potential Vanode are coupled to the base of the transistor 21 through the capacitor 24. However, the potential V2 is set to zero, so that a voltage (for example, a voltage of 0.8 V or higher) enough to turn on the transistor 21 is not generated at the base of the transistor 21 even when increasing or decreasing the anode potential Vanode. Thus, a collector current (second current) Ic2 of the transistor 21 is constantly 0 A. As a result, there is no difference between a collector current Ic1 of the transistor 11 and a collector current Ic3 of the cascode transistor 41, where a base current of the transistor 11 is ignored.

On the other hand, when the waveform shaping circuit 20 is operated as illustrated in FIG. 5, the optical output signal Pout and the anode potential Vanode are the same as those when the waveform shaping circuit 20 is stopped. Since the potential V2 is set to 600 mV, a peak potential close to 1.0 V is generated at the potential V2 at a rising transition of the optical output signal Pout from the level 0 to the level 1. Meanwhile, in a continuous pattern of the optical output signal Pout in which the level 1 consecutively continues, the anode potential Vanode does not contain a high-frequency component, and thus, is cut off by the filter circuit 26. Thus, the anode potential Vanode is not electrically coupled to the base of the transistor 21, and the potential V2 drops to about 600 mV. At a falling transition from the level 1 to the level 0 of the optical output signal Pout, a bottom potential having a shape similar, but reversed in the negative direction, to that of the peak potential generated at the rising transition of the optical output signal Pout is generated at the potential V2.

It is understood that only the high-frequency components of the anode potential Vanode corresponding to the rising transition of the optical output signal Pout is amplified by the rectifying action between the base and the emitter of the transistor 21 and is output as the collector current (second current) Ic2. The second current Ic2 is added to the first current Ic1 of the transistor 11. Since the rising transition of the optical output signal Pout corresponds to a falling transition of the output current Iout, the collector current Ic2 is added to the collector current Ic1 during the fall of the collector current Ic1. As a result, the transition time is lengthened only during the fall transition of the collector current Ic3 in the corrector current Ic3 (output current Iout) of the cascode transistor 41. That is, the transition time of the output current Iout is lengthened only during the rise transition of the drive current ILD.

Figure 6A:
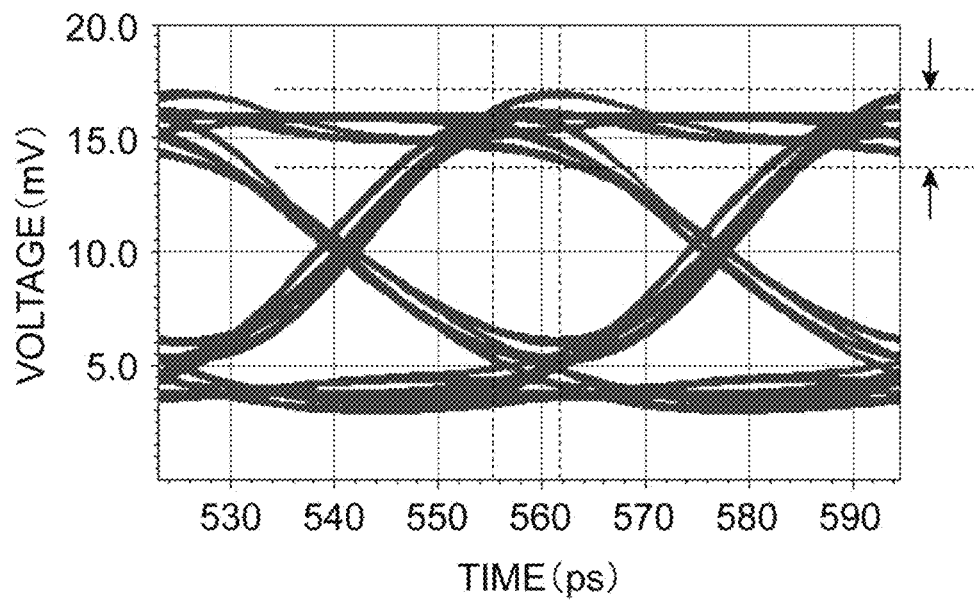
FIG. 6A is a graph illustrating an eye pattern of the optical output signal when the waveform shaping circuit of FIG. 3 is stopped.
Figure 6B:
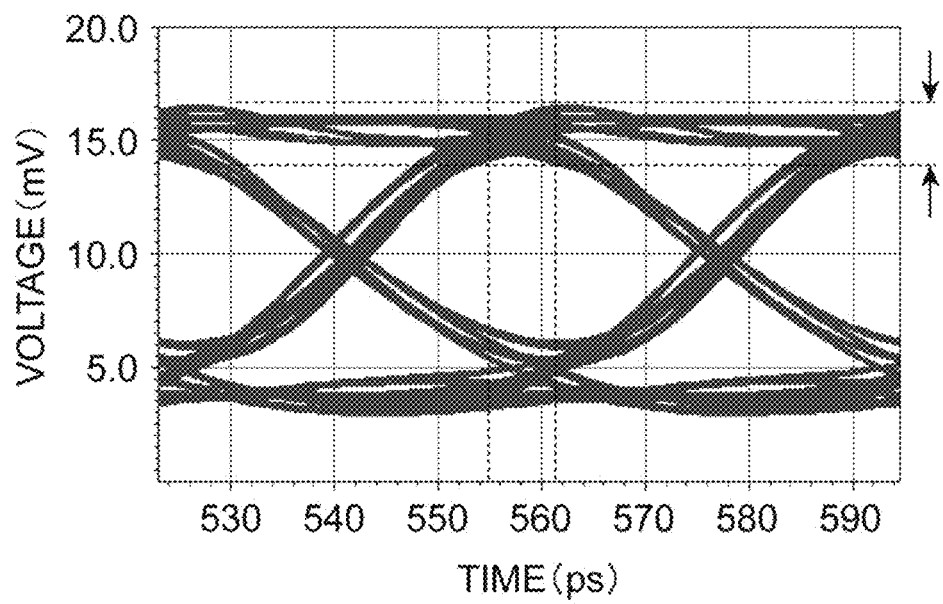
FIG. 6B is a graph illustrating an eye pattern of the optical output signal when the waveform shaping circuit of FIG. 3 is operated.

Next, functions and advantages of the driver circuit 3A will be described with reference to FIGS. 6A and 6B. FIG. 6A is a graph illustrating an eye pattern of the optical output signal when the waveform shaping circuit of FIG. 3 is stopped. FIG. 6B is a graph illustrating an eye pattern of the optical output signal when the waveform shaping circuit of FIG. 3 is operated.

As illustrated in FIGS. 6A and 6B, it is understood that the ISI at the level 1 is suppressed and the noise amplitude, which corresponds to a height indicated by two arrows, at the level 1 is lowered when the waveform shaping circuit 20 is operated as compared with the case where the waveform shaping circuit 20 is stopped. In this manner, the oscillation at the level 1 of the optical output signal Pout is suppressed while appropriately increasing the transition speed of the drive current ILD when the waveform shaping circuit 20 is operated. In other words, increasing the current value of the output current Iout by about one tenth of the output current Iout during the rise transition of the optical output signal Pout allows an SN ratio of the optical output signal Pout to be improved.

As described above, the same effect as that of the driver circuit 3 is also obtained in the driver circuit 3A.

Since the common emitter amplifier of the waveform shaping circuit 20 performs the negative feedback operation, Miller effect can be caused. That is, a stray capacitance practically appears between the base and the collector of the transistor 21, and the magnitude of the stray capacitance varies depending on the collector potential of the transistor 21. The fluctuation of the collector potential of the transistor 21 is reduced by providing the cascode transistor 41 at the output portion of the shunt circuit 10, so that the Miller effect can be reduced. That is, the driver circuit 3A allows the feedback to the base of the transistor 21 via the stray capacitance between the base and the collector of the transistor 21 and the fluctuation of the feedback amount to the base of the transistor 21 to be suppressed. As a result, the driver circuit 3A has an advantage to stabilize the adjustment of the current amount of the output current Iout as compared with the driver circuit 3. Similarly, the fluctuation of the collector potential of the transistor 11 is reduced by the cascode transistor 41, and thus, a Miller capacitance of the transistor 11 is reduced.

Second Embodiment

Figure 7:
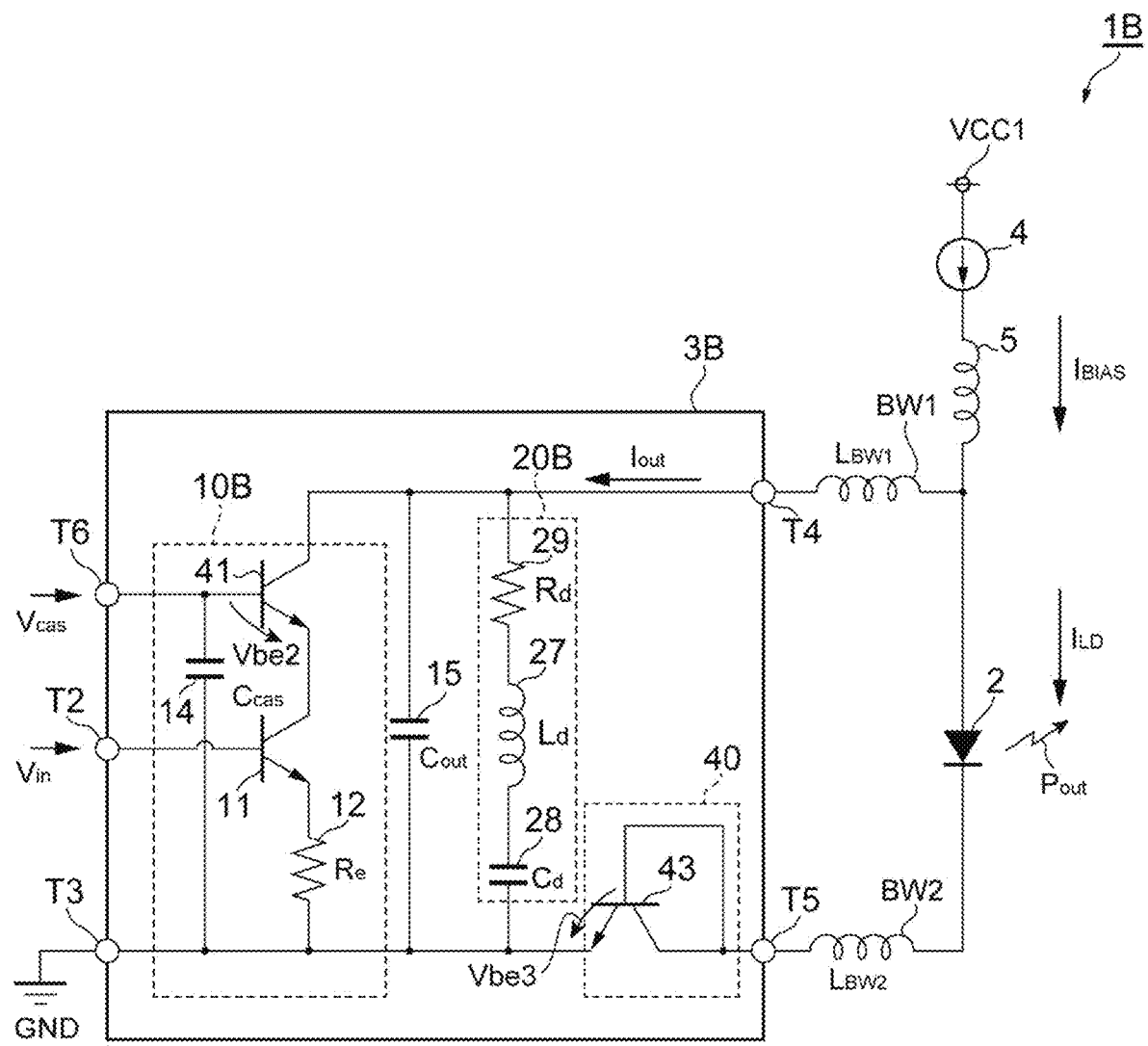
FIG. 7 is a diagram illustrating a schematic configuration of an optical transmitter including a driver circuit according to a second embodiment.

FIG. 7 is a diagram illustrating a schematic configuration of an optical transmitter including a driver circuit according to a second embodiment. As illustrated in FIG. 7, an optical transmitter 1B mainly includes a light emitting element 2 and a driver circuit 3B. The light emitting element 2 is, for example, a semiconductor laser element for direct modulation, and specifically, an edge-emitting semiconductor laser diode. Examples of such laser diodes include a distributed feedback laser diode (DFB-LD), a Fabry-Perot laser diode (FP-LD), and the like.

A cathode of the light emitting element 2 is electrically connected to a terminal T5 of the driver circuit 3B via a bonding wire BW2. An anode of the light emitting element 2 is connected in series to a bias current source 4 via a ferrite bead inductor (FBI) 5. The FBI 5 is an element configured to block transmission of a high-frequency current generated at the anode of the light emitting element 2 (for example, high-frequency components of a drive current $I_{LD}$) to the bias current source 4. Further, the anode of the light emitting element 2 is electrically connected to a terminal T4 (output terminal) of the driver circuit 3B via a bonding wire BW1. The bias current source 4 supplies a DC bias current $I_{BIAS}$ in order to cause the light emitting element 2 to emit light with predetermined power. The bias current source 4 is connected between a supply line VCC1 and the FBI 5 and supplies a bias current from the supply line VCC1 to the FBI 5. When the bias current $I_{BIAS}$ is increased, optical power of an optical output signal $P_{out}$ output from the light emitting element 2 increases.

The driver circuit 3B is a driver circuit of a direct modulation system, and is a circuit that supplies (increases or decreases) the drive current $I_{LD}$ flowing to the light emitting element 2 based on a shunt driving system. The driver circuit 3B is, for example, a driver circuit of a direct modulation system that can be used at high modulation speed of 25 Gb/s or higher. The driver circuit 3B modulates the light emitting element 2 by on-off keying by increasing or decreasing the drive current $I_{LD}$. The driver circuit 3B increases or decreases the drive current $I_{LD}$ in accordance with an input signal $V_{in}$, thereby increasing or decreasing the optical output signal $P_{out}$.

The driver circuit 3B has a terminal T6, a terminal T2 (input terminal), a terminal T3, the terminal T4, and the terminal T5. A constant voltage $V_{cas}$ is supplied to the terminal T6 from the outside. The input signal $V_{in}$ is supplied to the terminal T2 from the outside. The terminal T3 is electrically connected to a ground potential GND. The terminal T4 is electrically connected to the anode of the light emitting element 2 via the bonding wire BW1. The terminal T4 is connected to the bias current source 4 via the bonding wire BW1 and the FBI 5. That is, the terminal T4 is electrically connected between the bias current source 4 and the anode of the light emitting element 2. The terminal T5 is electrically connected to the cathode of the light emitting element 2 via the bonding wire BW2.

The driver circuit 3B increases or decreases the drive current $I_{LD}$ in accordance with the input signal $V_{in}$. Specifically, the driver circuit 3B generates an output current $I_{out}$ in accordance with the input signal $V_{in}$ supplied from the outside to the terminal T2. The output current $I_{out}$ is a signal for increasing or decreasing the drive current $I_{LD}$, and is shunted (bypassed) from a bias current $I_{BIAS}$ and flows into the driver circuit 3B from the terminal T4 via the bonding wire BW1. As a result, the drive current $I_{LD}$ flowing to the light emitting element 2 becomes a current obtained by combining the bias current $I_{BIAS}$ and the output current $I_{out}$. That is, since the drive current $I_{LD}$ is a current ($I_{BIAS}-I_{out}$) obtained by subtracting the output current $I_{out}$ from the bias current $I_{BIAS}$, a waveform of the drive current $I_{LD}$ has a shape obtained by vertically inverting a waveform of the output current $I_{out}$. Therefore, the optical output signal $P_{out}$ becomes a level 1 in power when the output current $I_{out}$ becomes a level 0, and the optical output signal $P_{out}$ becomes the level 0 in power when the output current $I_{out}$ becomes the level 1. The level 1 of the optical output signal $P_{out}$ is greater than the level 0 of the optical output signal $P_{out}$. The level 1 of the output current $I_{out}$ is smaller than the level 0 of the output current $I_{out}$.

With such a configuration, the drive current $I_{LD}$ derived from the bias current source 4 and the driver circuit 3B is supplied to the light emitting element 2 through the anode of the light emitting element 2, and the light emitting element 2 outputs the optical output signal $P_{out}$ in accordance with a change in the drive current $I_{LD}$.

The configuration of the driver circuit 3B will be described in more detail. The driver circuit 3B includes a shunt circuit (common emitter amplifier) 10B, a filter circuit 20B, and a level shift circuit 40.

The common emitter amplifier 10B is a circuit configured to generate the output current $I_{out}$ in accordance with the input signal $V_{in}$. The common emitter amplifier 10B decreases the drive current $I_{LD}$ by shunting (bypassing) the output current $I_{out}$ from the bias current $I_{BIAS}$ via the terminal T4. Further, when the output current $I_{out}$ is reduced, the current to be subtracted from the bias current $I_{BIAS}$ is reduced, so that the drive current $I_{LD}$ is increased. The common emitter amplifier 10B includes a transistor 11 (first transistor), a transistor 41 (second transistor), a resistive element 12, and a capacitor 14 (capacitive element).

The transistor 11 is, for example, an NPN bipolar transistor. A base (control terminal) of the transistor 11 is electrically connected to the terminal T2. The input signal $V_{in}$ is input to the base of the transistor 11 via the terminal T2. An emitter (second current terminal) of the transistor 11 is connected to the ground potential GND via the resistive element 12 and the terminal T3. That is, the transistor 11 and the resistive element 12 constitute a common emitter amplifier. A collector (first current terminal) of the transistor 11 is connected to an emitter (second current terminal) of the transistor 41.

The transistor 41 is, for example, an NPN bipolar transistor. A base (control terminal) of the transistor 41 is electrically connected to the terminal T6. The constant voltage $V_{cas}$ is supplied (applied) to the base of the transistor 41 via the terminal T6. A voltage source (not illustrated) supplies the constant voltage $V_{cas}$ and provides a low impedance (internal resistance) to the terminal T6. A collector potential of the transistor 11 is preferably fixed in a wide frequency range.

The base of the transistor 41 is connected to the ground potential GND via the capacitor 14 and the terminal T3 in order to lower the impedance in a high frequency range viewed from the terminal T6. That is, the capacitor 14 is electrically connected between the base of the transistor 41 and the ground potential GND. The emitter of the transistor 41 is electrically connected to the collector of the transistor 11. A collector (first current terminal) of the transistor 41 is electrically connected to the terminal T4 and is electrically connected to the anode of the light emitting element 2 via the terminal T4 and the bonding wire BW1. That is, the transistor 41 is, for example, a cascode transistor. Incidentally, the capacitor 14 may include a plurality of capacitors having mutually different electrostatic capacitance values.

A bias voltage necessary for operating the transistor 11 in Class A mode is supplied to the base of the transistor 11 via the terminal T2. That is, the bias voltage is superimposed on the input signal $V_{in}$. As a result, for example, a current of about 10 mA to 30 mA flows to the transistor 11. When the input signal $V_{in}$ is inputted to the base of the transistor 11 in the common emitter amplifier 10B having such a configuration, the output current $I_{out}$ having a current value corresponding to a voltage level of the input signal $V_{in}$ is sank (output) to the collector of the transistor 41. A gain of the common emitter amplifier 10B is determined based on a resistance value R of the resistive element 12, and is about R/Re, for example, when a resistance value of a load circuit is assumed as R.

A capacitance 15 is a parasitic capacitor appearing at an output of the common emitter amplifier 10B. That is, the parasitic capacitance 15 is assumed to be between the collector of the transistor 41 and a ground line electrically connected to the terminal T3.

The filter circuit 20B is a damping filter configured to cause a part of a high-frequency current generated by switching of the common emitter amplifier 10B (for example, high-frequency components of the output current $I_{out}$) to bypass to the ground potential GND. The filter circuit 20B includes a resistive element 29, an inductor 27, and a capacitor 28. The resistive element 29, the inductor 27, and the capacitor 28 are connected in series in this order between the terminals T4 and T5 of the driver circuit 3B. That is, the filter circuit 20B is connected in parallel with the common emitter amplifier 10B, and is electrically connected between the collector of the transistor 41 and the ground potential GND.

The level shift circuit 40 (voltage shift circuit) is a circuit configured to set a potential of the cathode of the light emitting element 2 to be higher than the ground potential GND. The level shift circuit 40 is electrically connected to the cathode of the light emitting element 2 via the terminal T5 and the bonding wire BW2. The level shift circuit 40 includes, for example, a diode-connected transistor 43. The transistor 43 is, for example, an NPN bipolar transistor. A base and a collector of the transistor 43 are connected to each other (such a connection is referred to as a diode connection) and are electrically connected to the terminal T5. An emitter of the transistor 43 is electrically connected to the ground potential GND via a ground line of the driver circuit 3B and the terminal T3. Due to the diode connection, a collector current of the transistor 43 shows a diode characteristic with respect to a collector potential. A voltage drop (voltage shift) is generated by causing a predetermined current to flow to the transistor 43 exhibiting the diode characteristic. In this manner, the level shift circuit 40 can set the potential of the cathode of the light emitting element 2 to be higher than the ground potential GND by utilizing the diode characteristic. The transistor 43 may be a diode.

The potential of the cathode of the light emitting element 2 can be set to be higher, for example, by a voltage Vbe3 between the base and the emitter of the transistor 43, than the ground potential GND by the level shift circuit 40. Thus, a potential of the anode of the light emitting element 2 is Vf+Vbe3 obtained by adding the base-emitter voltage Vbe3 to a forward bias voltage Vf of the light emitting element 2. A potential difference between the potential of the cathode of the light emitting element 2 and the ground potential GND is set to be substantially equal to a potential difference between the constant voltage $V_{cas}$ and an emitter potential of the transistor 41. That is, the base-emitter voltage Vbe3 of the transistor 43 is substantially equal to a voltage Vbe2 between the base and the emitter of the transistor 41.

In the driver circuit 3B configured as described above, the output current $I_{out}$ is increased or decreased in accordance with the input signal $V_{in}$ input to the base of the transistor 11, and the output current $I_{out}$ is shunted from the bias current $I_{BIAS}$ via the terminal T4, whereby the drive current $I_{LD}$ flowing to the light emitting element 2 is increased or decreased.

The terminal T4 and the anode of the light emitting element 2 are electrically connected via the bonding wire BW1, and the level shift circuit 40 and the cathode of the light emitting element 2 are electrically connected via the terminal T5 and the bonding wire BW2. Here, a total inductance $L_{BW}$ of the bonding wires BW1 and BW2 can be regarded as the sum of an inductance $L_{BW1}$ of the bonding wire BW1 and an inductance $L_{BW2}$ of the bonding wire BW2. An electromotive force E is generated due to the inductance $L_{BW}$ of the bonding wires BW1 and BW2 in accordance with a change in the output current $I_{out}$. This electromotive force E is expressed by Formula (1). As the bonding wires BW1 and BW2 become longer, the inductance $L_B W$ increases and the electromotive force E also increases. For example, if a current value of the output current $I_{out}$ changes by 40 mA for a transition time of 25 psec, the electromotive force E of −0.8 V is generated when the inductance $L_{BW}$ is 500 pH.

[Formula 1]

$$E = -L_{BW} \times \frac{dI_{out}}{dt} \quad (1)$$

Since the collector of the transistor 41 is electrically connected to the terminal T4 in the driver circuit 3B, the electromotive force E is applied to the collector of the transistor 41. However, since the constant voltage $V_{cas}$ is applied to the base of the transistor 41, the emitter potential of the transistor 41 becomes a potential ($=V_{cas}$−Vbe2) obtained by subtracting the base-emitter voltage Vbe2 of the transistor 41 from the constant voltage $V_{cas}$. Since the emitter of the transistor 41 and the collector of the transistor 11 are connected to each other, the collector of the transistor 11 also has the potential obtained by subtracting the base-emitter voltage Vbe2 of the transistor 41 from the constant voltage $V_{cas}$. Thus, the collector potential of the transistor 11 becomes substantially constant, and fluctuation of the collector potential of the transistor 11 caused by the electromotive force E is suppressed.

Figure 8:
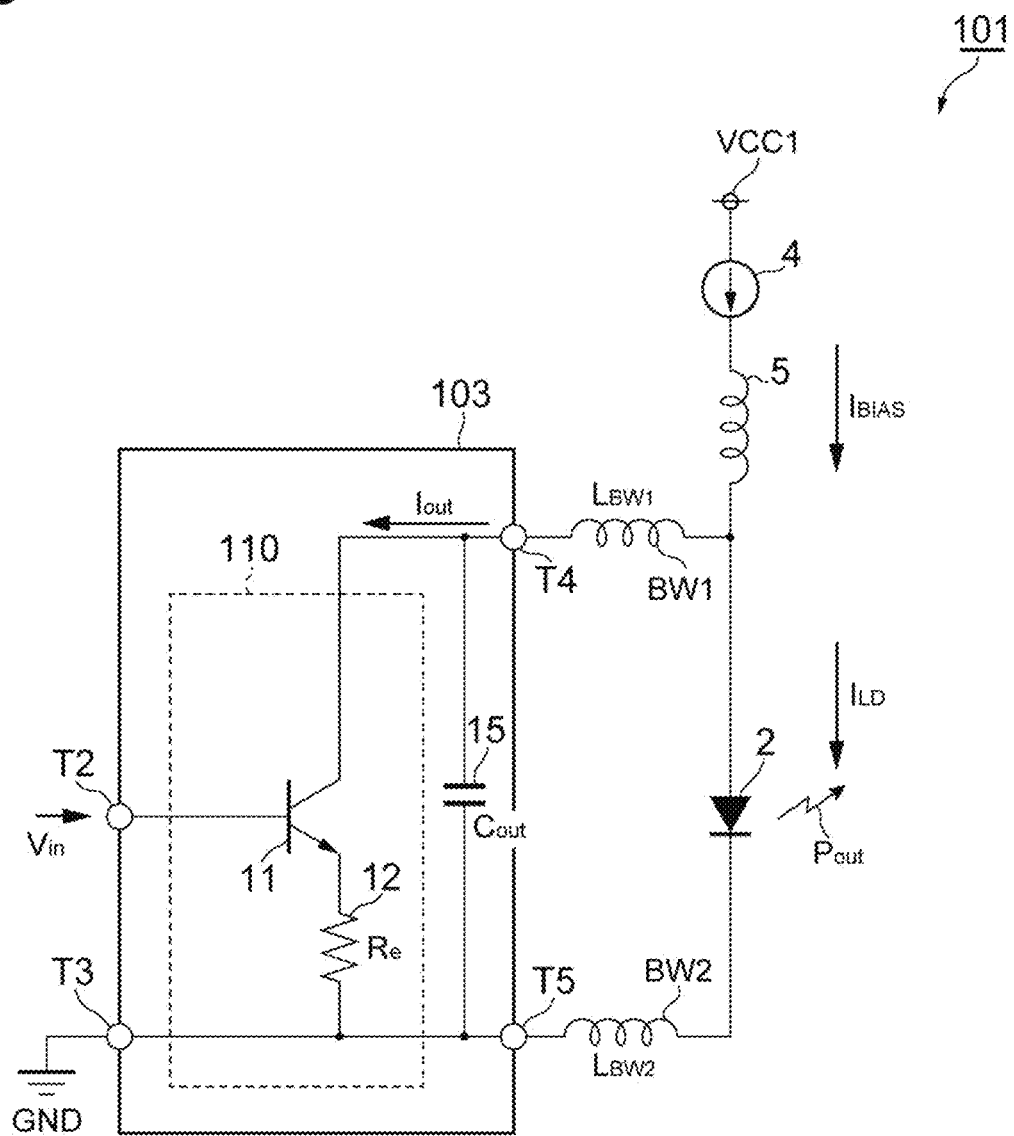
FIG. 8 is a diagram illustrating a schematic configuration of an optical transmitter including a driver circuit according to a comparative example of the second embodiment.
Figure 9:
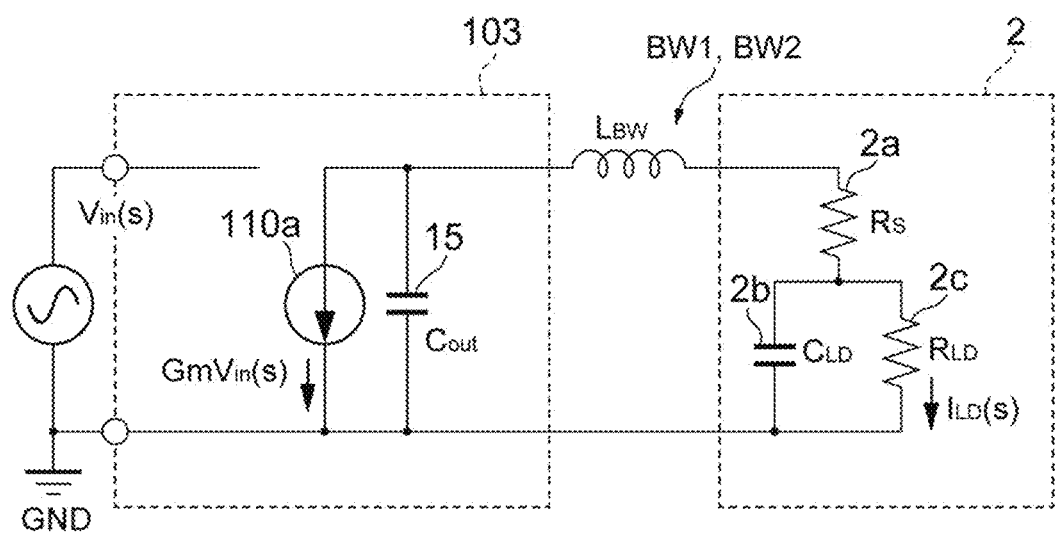
FIG. 9 is a diagram illustrating an equivalent circuit of the optical transmitter in FIG. 8.
Figure 10:
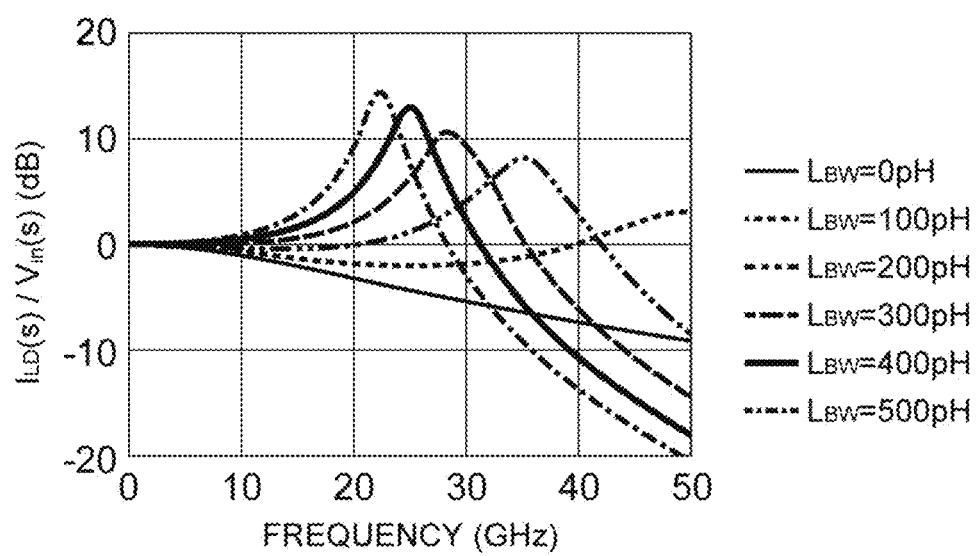
FIG. 10 is a graph illustrating a frequency response characteristic from an input signal to a drive current in the driver circuit of FIG. 8.
Figure 11:
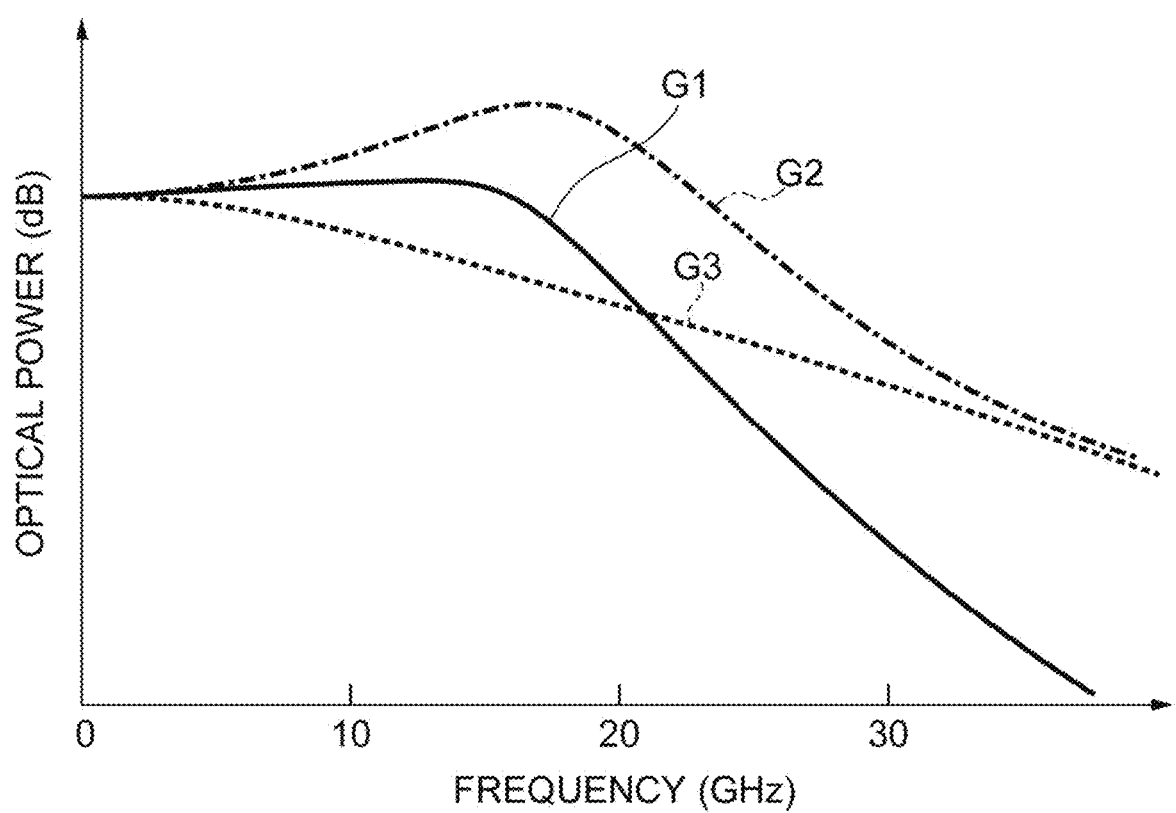
FIG. 11 is a graph for describing a frequency response characteristic from the input signal to an optical output signal and a frequency response characteristic from the drive current to the optical output signal in the driver circuit in FIG. 8.

Next, the influence of the bonding wire in the optical transmitter 1B including the driver circuit 3B will be described in comparison with an optical transmitter including a driver circuit of a comparative example with reference to FIGS. 8 to 16D. First, the optical transmitter including the driver circuit of the comparative example (second comparative example) of the second embodiment will be described. FIG. 8 is a diagram illustrating a schematic configuration of the optical transmitter including the driver circuit of the second comparative example. FIG. 9 is a diagram illustrating an equivalent circuit of the optical transmitter in FIG. 8. FIG. 10 is a graph illustrating a frequency response characteristic from an input signal to a drive current in the driver circuit of FIG. 8. FIG. 11 is a graph for describing a frequency response characteristic from the input signal to an optical output signal and a frequency response characteristic from the drive current to the optical output signal in the driver circuit in FIG. 8. A horizontal axis of FIG. 10 represents a frequency (GHz) of an input signal $V_{in}$, and a vertical axis of FIG. 10 represents a normalized frequency response characteristic IL (s)/$V_{in}$ (s) (dB) of the input signal $V_{in}$ to a drive current $I_{LD}$. A horizontal axis of FIG. 11 represents the frequency (GHz) of the input signal $V_{in}$, and a vertical axis of FIG. 11 represents optical power (dB) of a normalized optical output signal.

As illustrated in FIG. 8, an optical transmitter 101 of the second comparative example is mainly different from the optical transmitter 1B in terms that a driver circuit 103 is provided in place of the driver circuit 3B. The driver circuit 103 is mainly different from the driver circuit 3B in terms that a common emitter amplifier 110 is provided in place of the common emitter amplifier 10B and the filter circuit 20B and the terminal T6 are not provided. The common emitter amplifier 110 is mainly different from the common emitter amplifier 10B in terms of not including the transistor 41 and the capacitor 14.

In this driver circuit 103, an output current $I_{out}$ is generated by the common emitter amplifier 110 in accordance with the input signal $V_{in}$ and shunted from a bias current $I_{BIAS}$ via a bonding wire BW1. As the output current $I_{out}$ increases or decreases, the drive current $I_{LD}$ flowing to a light emitting element 2 increases or decreases.

As illustrated in FIG. 9, the driver circuit 103 can be equivalently represented by a circuit in which a current source 110a and a parasitic capacitance 15 are connected in parallel. The current source 110a is configured to supply a current having a current value obtained by multiplying a transconductance Gm by the input signal $V_{in}$ (s). The light emitting element 2 can be equivalently represented by a circuit in which a resistive element 2a having a resistance value $R_S$ and a parallel circuit are connected in series. The parallel circuit is a circuit in which a capacitor 2b having a capacitance value $C_{LD}$ and a resistive element 2c having a resistance value $R_{LD}$ are connected in parallel. An inductance $L_{BW}$ of bonding wires can be regarded as the sum of an inductance $L_{BW1}$ of the bonding wire BW1 and an inductance $L_{BW2}$ of a bonding wire BW2. Thus, from the equivalent circuit illustrated in FIG. 9, the drive current $I_{LD}$ (s) flowing to the resistive element 2c of the light emitting element 2 contributing to an optical output signal $P_{out}$ is expressed by Formula (2) using the transconductance Gm of the common emitter amplifier 110. The drive current $I_{LD}$ (S) is a frequency response of a current flowing to an active layer of the light emitting element 2.

[Formula 2]

$$I_{LD}(s) = \frac{Gm}{1 + (C_{LD}R_{LD} + C_{out}(R_{LD} + R_s))s + (C_{out}L_{BW} + C_{LD}R_{LD}C_{out}R_s)s^2 + C_{out}L_{BW}C_{LD}R_{LD}s^3} V_{in}(s) \quad (2)$$

In Formula (2), when a capacitance value $C_{out}$ of the parasitic capacitance 15 is 0.1 pF, the capacitance value $C_{LD}$ of the light emitting element 2 is 4 pF, the resistance value $R_{LD}$ is 2Ω, and the resistance value $R_S$ is 8Ω, frequency response characteristics as illustrated in FIG. 10 are obtained. As illustrated in FIG. 10, a resonance frequency indicating a peak of a graph moves depending on the inductance $L_{BW}$ of the bonding wire in the optical transmitter 101. Specifically, no resonance occurs when the inductance $L_{BW}$ is 0 pH. The resonance frequency becomes 50 GHz when the inductance $L_{BW}$ is 100 pH, the resonance frequency becomes 35 GHz when the inductance $L_{BW}$ is 200 pH, and the resonance frequency becomes 22 GHz when the inductance $L_{BW}$ is 500 pH. As described above, the resonance frequency decreases as the inductance $L_{BW}$ increases.

The resonance frequency appears near a frequency determined by $1/(2\pi(L_{BW} \times C_{out})^{1/2})$. That is, when the bonding wires BW1 and BW2 become longer and the inductance $L_{BW}$ becomes larger, the resonance frequency decreases, which greatly affects the optical output signal $P_{out}$.

A response characteristic G1 illustrated in FIG. 11 is an ideal total response (frequency response) from a signal source of the input signal $V_{in}$ to the optical output signal $P_{out}$. A response characteristic G2 is a response from the drive current $I_{LD}$ (S) to the optical output signal $P_{out}$ in the optical transmitter 101. A response characteristic G3 is an optimum response from the drive current $I_{LD}$ (S) to the optical output signal $P_{out}$. The response characteristic G2 has peaking at a frequency near 18 to 20 GHz under the influence of relaxation oscillation of the light emitting element 2. On the other hand, the response characteristic G3 has such a characteristic that there is no peaking and a gain gradually decreases as the frequency increases. As described above, the resonance frequency decreases as the inductance $L_{BW}$ of the bonding wires BW1 and BW2 increases in the driver circuit 103 of the second comparative example, and thus, it is difficult to obtain characteristics such as the response characteristic G3.

Figure 12:
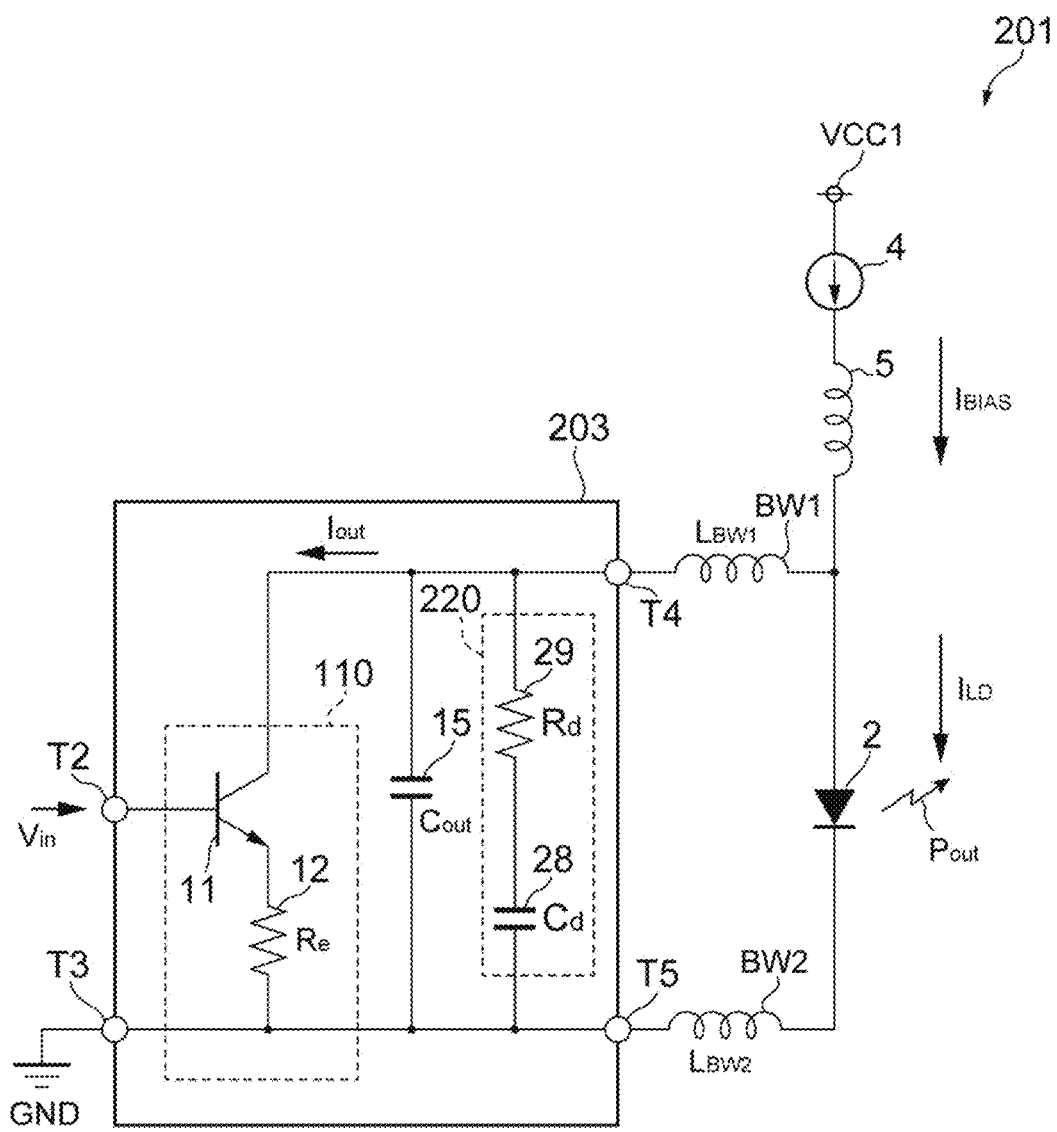
FIG. 12 is a diagram illustrating a schematic configuration of an optical transmitter including a driver circuit according to another comparative example of the second embodiment.
Figure 13A:
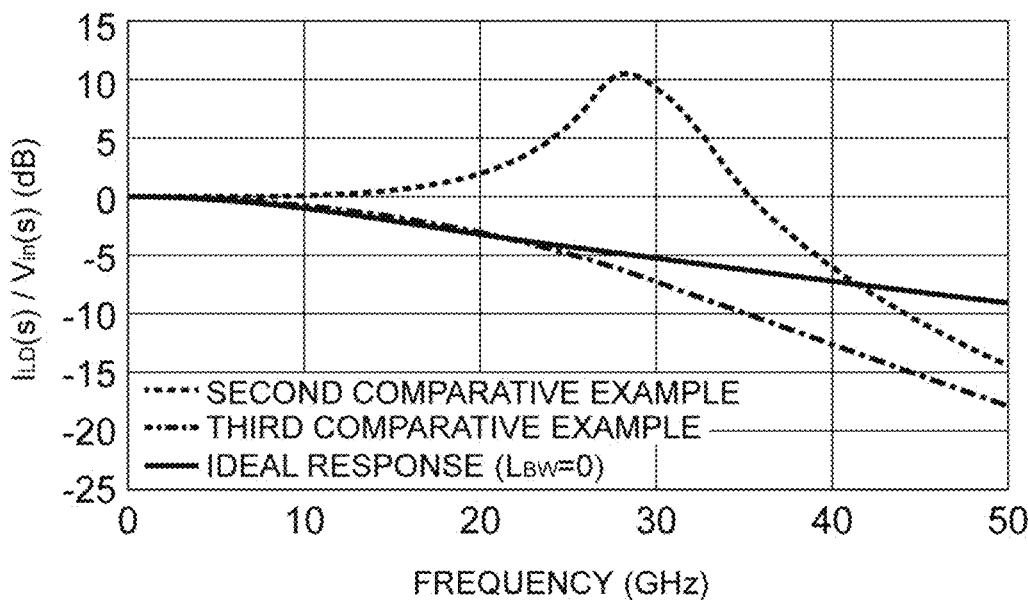
FIG. 13A is a graph illustrating a frequency response characteristic from an input signal to a drive current in the driver circuits of FIGS. 8 and 12 when an inductance of a bonding wire is 300 pH.
Figure 13B:
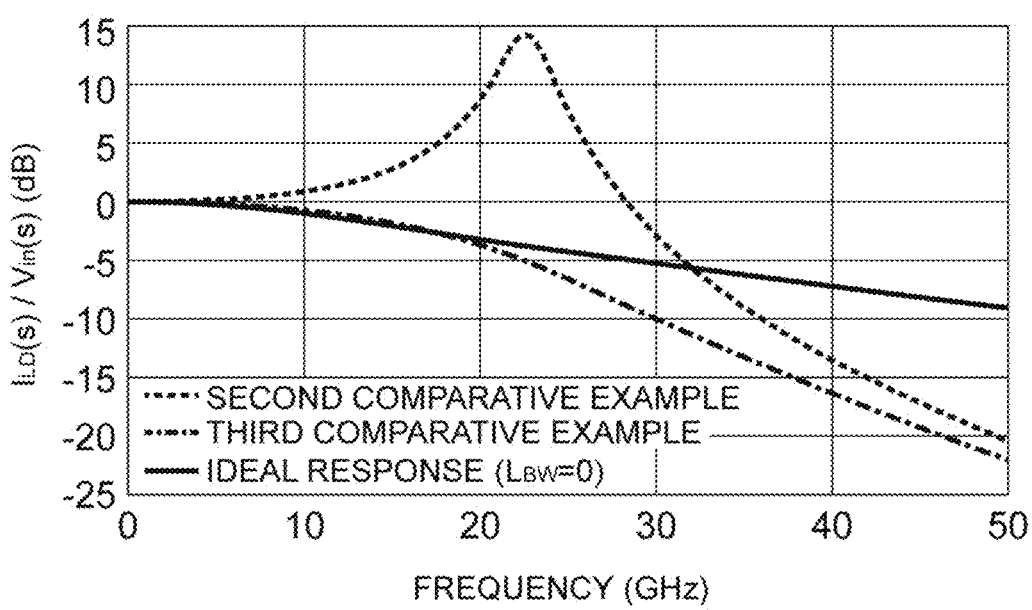
FIG. 13B is a graph illustrating the frequency response characteristic from the input signal to the drive current in the driver circuits of FIGS. 8 and 12 when the inductance of the bonding wire is 500 pH.

Subsequently, an optical transmitter including a driver circuit of a third comparative example will be described. FIG. 12 is a diagram illustrating a schematic configuration of the optical transmitter including the driver circuit of the third comparative example. FIG. 13A is a graph illustrating a frequency response characteristic from an input signal to a drive current in the driver circuits of FIGS. 8 and 12 when an inductance of a bonding wire is 300 pH. FIG. 13B is a graph illustrating the frequency response characteristic from the input signal to the drive current in the driver circuits of FIGS. 8 and 12 when the inductance of the bonding wire is 500 pH. A horizontal axis in FIGS. 13A and 13B represents a frequency (GHz) of an input signal $V_{in}$, and a vertical axis in FIGS. 13A and 13B represents a normalized frequency response characteristic $I_{LD}$ (s)/$V_{in}$ (s) (dB) of the input signal $V_{in}$ to a drive current $I_{LD}$.

As illustrated in FIG. 12, an optical transmitter 201 of the third comparative example is mainly different from the optical transmitter 101 in terms that a driver circuit 203 is provided in place of the driver circuit 103. The driver circuit 203 is mainly different from the driver circuit 103 in terms of including a filter circuit 220. The filter circuit 220 is a damping filter (filter circuit) configured to cause a part of a high-frequency current (high-frequency components of an output current $I_{out}$) generated by a switching operation of a common emitter amplifier 110 to bypass to a ground potential GND. The filter circuit 220 is different from the filter circuit 20B in terms of not including the inductor 27.

In the driver circuit 203, peaking due to resonance can be suppressed by the filter circuit 220. Thus, when bonding wires BW1 and BW2 are short (for example, $L_{BW}$=300 pH), a response characteristic of a drive current $I_{LD}$ approximates to an ideal response characteristic ($L_{BW}$=0 pH) up to around 22 GHz as illustrated in FIG. 13A. Incidentally, a resistance value $R_d$ of a resistive element 29 is set to 50Ω and a capacitance value $C_d$ of a capacitor 28 is set to 0.6 pF.

When the bonding wires BW1 and BW2 are long (for example, $L_{BW}$=500 pH), a resonance frequency decreases as compared to the case of $L_{BW}$=300 pH. Since an impedance of a light emitting element 2 side viewed from the driver circuit 203 becomes high in a high frequency range, it is necessary to increase the output impedance of the driver circuit 203 on the high frequency side by adjusting the resistance value $R_d$ and the capacitance value $C_d$ of the filter circuit 220. In addition, the gain rises even at frequencies equal to or below 10 GHz due to the decrease of the resonance frequency, and thus, it is necessary to prevent the impedance from rising by increasing the capacitance value $C_d$ on a low frequency side. For example, the resistance value $R_d$ of the resistive element 29 is set to 65Ω, and the capacitance value $C_d$ of the capacitor 28 is set to 1 pF.

In this case, the response characteristic of the drive current $I_{LD}$ approximates to the ideal response characteristic up to around 18 GHz as illustrated in FIG. 13B. However, the gain is reduced by about 5 dB in the response characteristic of the drive current IL as compared with the ideal response characteristic around 30 GHz. Thus, a roll-off characteristic has a steep inclination so that jitter is likely to occur in an optical output waveform. In this manner, it is necessary to shorten the bonding wires BW1 and BW2 in the driver circuit 203, so that there is a restriction on mounting of the driver circuit 203. That is, it is necessary to place the light emitting element 2 and the driver circuit 203 close to each other, and thus, there may be a case, for example, where it is necessary to mount the light emitting element 2 and the driver circuit 203 on the same carrier. For example, when the optical transmitter 201 conforms to 100 GE-LR4 standardized by the Institute of Electrical and Electronic Engineers (IEEE), however, there is a risk that a load (heat capacity) of a temperature control element (for example, TEC) may increase so that power consumption of the temperature control element may increase if the temperature of not only the light emitting element 2 but also the driver circuit 203 mounted on the same carrier is controlled.

Figure 14:
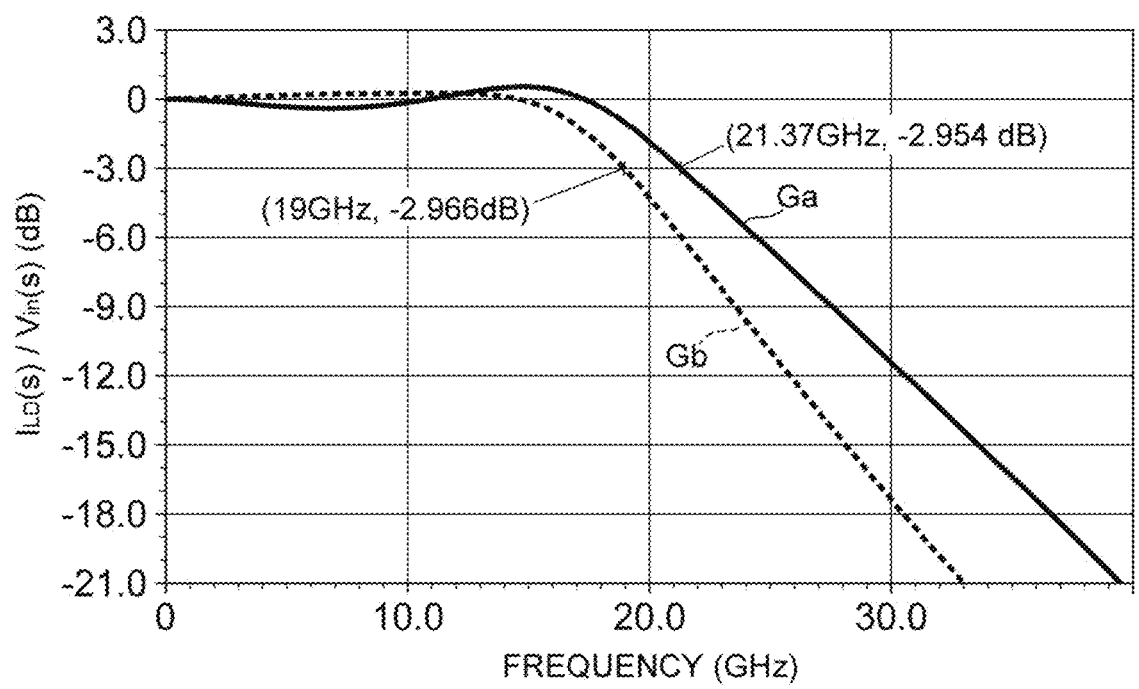
FIG. 14 is a graph illustrating a frequency response characteristic from an input signal to a drive current in the driver circuits of FIGS. 7 and 12.
Figure 15A:
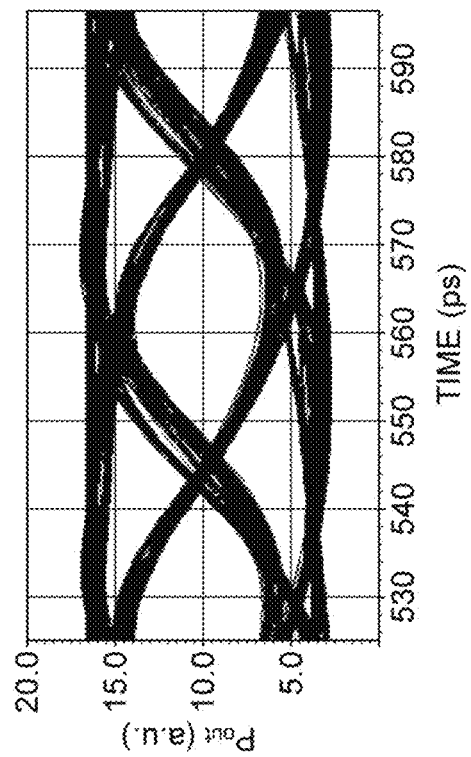
FIG. 15A is a graph illustrating a terminal voltage of an output transistor in the driver circuit of FIG. 12.
Figure 15B:
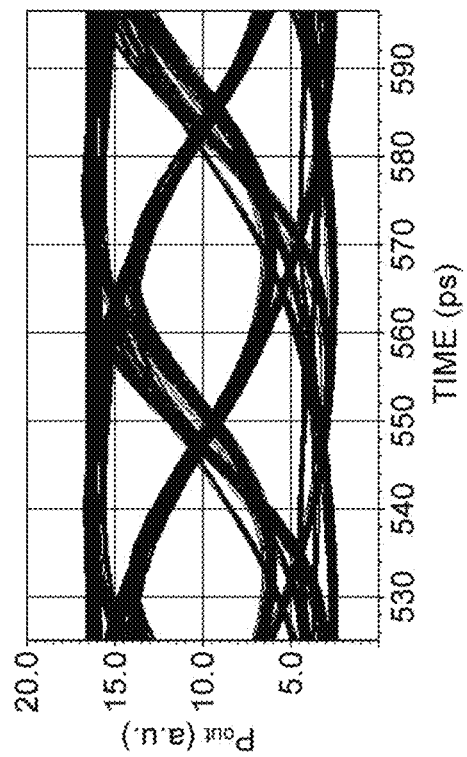
FIG. 15B is a graph illustrating the terminal voltage of the output transistor in the driver circuit of FIG. 12.
Figure 15C:
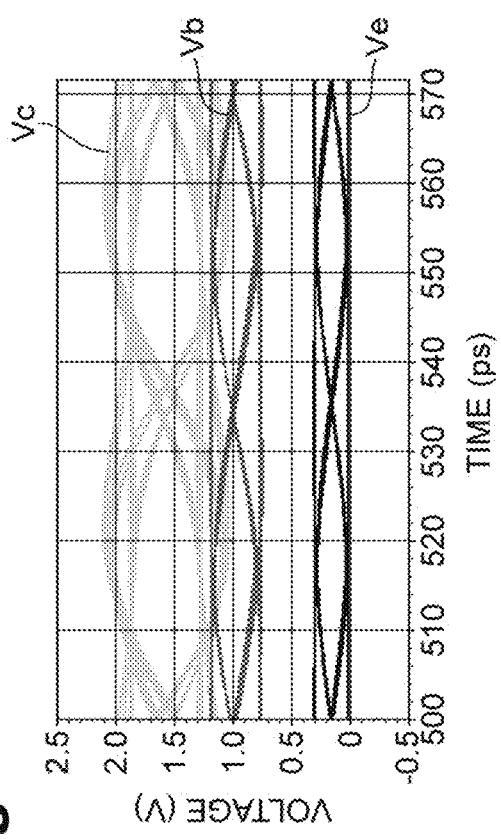
FIG. 15C is a graph illustrating a waveform of an optical output signal in the optical transmitter of FIG. 12.
Figure 15D:
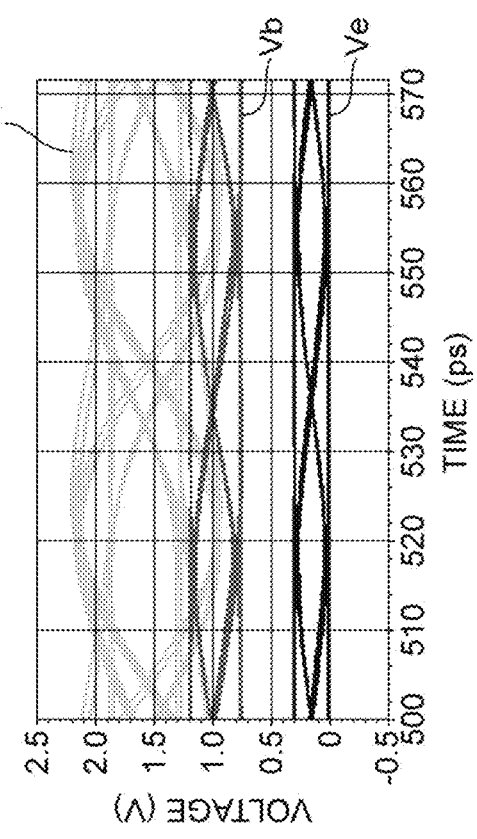
FIG. 15D is a graph illustrating the waveform of the optical output signal in the optical transmitter of FIG. 12.
Figure 16A:
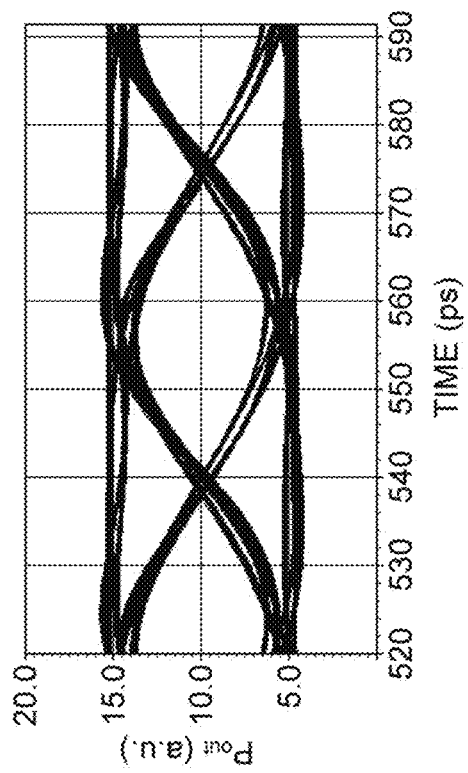
FIG. 16A is a graph illustrating a terminal voltage of an output transistor in the driver circuit of FIG. 7.
Figure 16B:
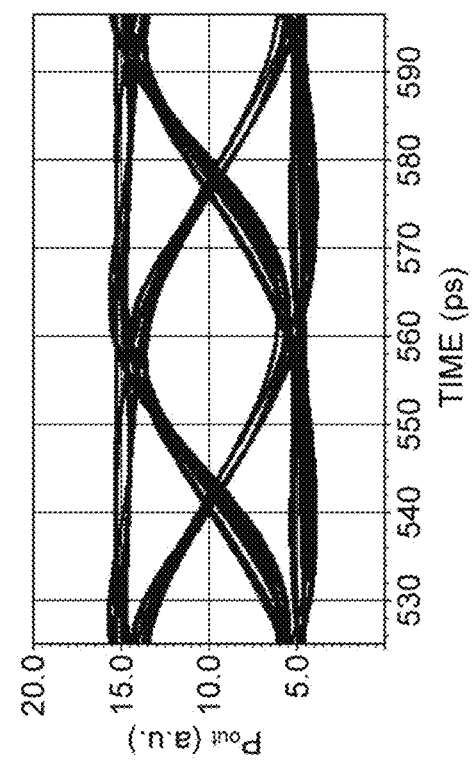
FIG. 16B is a graph illustrating the terminal voltage of the output transistor in the driver circuit of FIG. 7.
Figure 16C:
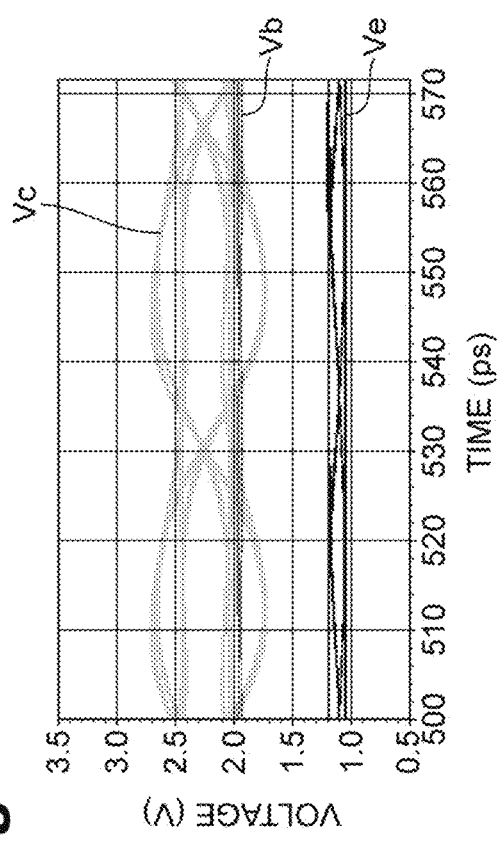
FIG. 16C is a graph illustrating a waveform of an optical output signal in the optical transmitter of FIG. 7.
Figure 16D:
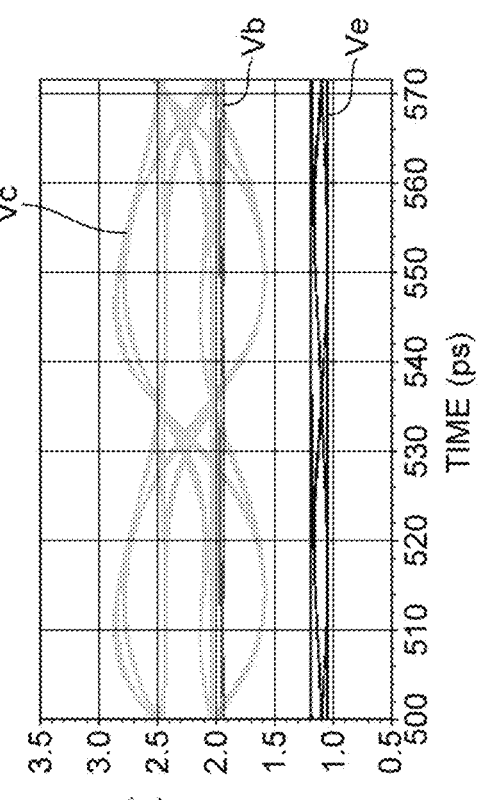
FIG. 16D is a graph illustrating the waveform of the optical output signal in the optical transmitter of FIG. 7.

Subsequently, the influence of the bonding wire in the optical transmitter 1B including the driver circuit 3B will be described. FIG. 14 is a graph illustrating a frequency response characteristic from an input signal to a drive current in the driver circuits of FIGS. 7 and 12. FIG. 15A is a graph illustrating a terminal voltage of an output transistor in the driver circuit of FIG. 12 when the inductance of the bonding wire is 300 pH. FIG. 15B is a graph illustrating the terminal voltage of the output transistor in the driver circuit of FIG. 12 when the inductance of the bonding wire is 500 pH. FIG. 15C is a graph illustrating a waveform of an optical output signal in the optical transmitter of FIG. 12 when the inductance of the bonding wire is 300 pH. FIG. 15D is a graph illustrating the waveform of the optical output signal in the optical transmitter of FIG. 12 when the inductance of the bonding wire is 500 pH. FIG. 16A is a graph illustrating a terminal voltage of an output transistor in the driver circuit of FIG. 7 when the inductance of the bonding wire is 300 pH. FIG. 16B is a graph illustrating the terminal voltage of the output transistor in the driver circuit of FIG. 7 when the inductance of the bonding wire is 500 pH. FIG. 16C is a graph illustrating a waveform of an optical output signal in the optical transmitter of FIG. 7 when the inductance of the bonding wire is 300 pH. FIG. 16D is a graph illustrating the waveform of the optical output signal in the optical transmitter of FIG. 7 when the inductance of the bonding wire is 500 pH.

A horizontal axis of FIG. 14 represents the frequency (GHz) of the input signal $V_{in}$, and a vertical axis of FIG. 14 represents the normalized frequency response characteristic $I_{LD}(s)/V_{in}(s)$ (dB) of the input signal $V_{in}$ to the drive current $I_{LD}$. Horizontal axes of FIGS. 15A, 15B, 16A, and 16B represent a time (ps), and vertical axes of FIGS. 15A, 15B, 16A, and 16B represent a voltage (V). Horizontal axes of FIGS. 15C, 15D, 16C, and 16D represent a time (ps), and vertical axes of FIGS. 15C, 15D, 16C, and 16D represent an intensity (a.u.) of the optical output signal. Incidentally, "a.u." means an arbitrary unit. The transistor 11 outputs the output current $I_{out}$ in the driver circuit 203 of FIG. 12, and the transistor 41 outputs the output current $I_{out}$ in the driver circuit 3B of FIG. 7. Therefore, FIGS. 15A and 15B illustrate terminal voltages (a base potential Vb, an emitter potential Ve, and a collector potential Vc) of the transistor 11, and FIGS. 16A and 16B illustrate terminal voltages (a base potential Vb, an emitter potential Ve, and a collector potential Vc) of the transistor 41.

Characteristics illustrated in FIG. 14 are frequency response characteristics from the input signal $V_{in}$ to the drive current $I_{LD}$ when the inductance $L_{BW}$ of the bonding wires BW1 and BW2 is 500 pH. A characteristic Ga is a characteristic in the case of using the driver circuit 3B, and a characteristic Gb is a characteristic in the case of using the driver circuit 203 of the third comparative example. Incidentally, the resistance value $R_d$ of the resistive element 29 is set to 50 S and the capacitance value $C_d$ of the capacitor 28 is set to 0.6 pF in the driver circuit 203. In the driver circuit 3B, the resistance value $R_d$ of the resistive element 29 is set to 80 f, the inductance $L_d$ of the inductor 27 is set to 250 pH, and the capacitance value $C_d$ of the capacitor 28 is set to 1.0 pF.

As illustrated in FIG. 14, a 3-dB band is about 19 GHz, and a roll-off attenuation characteristic (inclination) is steep at a frequency of 20 GHz or higher in the characteristic Gb. In the characteristic Ga, a 3-dB band is about 21.4 GHz, and a roll-off attenuation characteristic is relatively mitigated at the frequency of 20 GHz or higher than that in the characteristic Gb. A gain difference between the characteristic Ga and the characteristic Gb at 30 GHz is about 6 dB. In this manner, the frequency response characteristic is improved in the driver circuit 3B although the bonding wires BW1 and BW2 are long.

As the inductance $L_{BW}$ of the bonding wires BW1 and BW2 increases, the undershoot of the terminal voltage (collector potential) of the transistor 11 caused by the electromotive force E increases. Thus, the voltage between the collector and the base of the transistor 11 is biased in the forward direction, and an input capacitance viewed from the base of the transistor 11 is increased due to the Miller effect. As a result, the jitter of the terminal voltage (collector potential Vc) of the transistor 11 increases as illustrated in FIGS. 15A and 15B, and the waveform of the optical output signal $P_{out}$ is degraded as illustrated in FIGS. 15C and 15D.

On the other hand, the base of the transistor 41 is grounded by the capacitor 14 on the high frequency side in the driver circuit 3B. Thus, the fluctuation of the collector potential Vc of the transistor 11 for current amplification, which is generated in the driver circuit 203, is absorbed by the transistor 41 as illustrated in FIGS. 16A and 16B, and thus, the collector potential Vc of the transistor 11 is stabilized. Therefore, the input capacitance viewed from the base of the transistor 11 does not increase due to the electromotive force E, and the jitter does not occur in the terminal voltage (collector potential Vc) of the transistor 41. Therefore, the driver circuit 3B of FIG. 7 allows the influence of the inductance $L_{BW}$ of the bonding wires BW1 and BW2 on the optical output signal $P_{out}$ to be suppressed. As a result, the waveform of the optical output signal $P_{out}$ is hardly degraded even if the inductance $L_{BW}$ of the bonding wires BW1 and BW2 is increased as illustrated in FIGS. 16C and 16D. Incidentally, the capacitor 14 may include a plurality of capacitors having mutually different electrostatic capacitance values.

As described above, in the driver circuit 3B, the output current $I_{out}$ is generated in accordance with the input signal $V_{in}$ input to the base of the transistor 11, and the output current $I_{out}$ is shunted from the bias current $I_{BIAS}$ via the terminal T4, whereby the drive current IL flowing to the light emitting element 2 is increased or decreased. The terminal T4 and the anode of the light emitting element 2 are electrically connected via the bonding wire BW1, and the level shift circuit 40 and the cathode of the light emitting element 2 are electrically connected via the bonding wire BW2. The electromotive force is generated due to the inductance $L_{BW}$ of the bonding wires BW1 and BW2 in accordance with the change in the output current $I_{out}$. The longer the bonding wires BW1 and BW2 are, the larger the electromotive force becomes.

The collector of the transistor 11 and the emitter of the transistor 41 are electrically connected to each other in the common emitter amplifier 10B. The above-described electromotive force is applied to the collector of the transistor 41 since the collector of the transistor 41 is electrically connected to the terminal T4. However, the fluctuation of the emitter potential of the transistor 41 is suppressed since the constant voltage $V_{cas}$ is applied to the base of the transistor 41. As a result, the fluctuation of a collector potential of the transistor 11 is suppressed. A stray capacitance is generated between the base and the collector of the transistor 11, and the stray capacitance fluctuates depending on the collector potential of the transistor 11. However, the fluctuation of the collector potential of the transistor 11 is suppressed, and thus, transmission of the potential fluctuation thereof to the base of the transistor 11 via the stray capacitance is suppressed. As a result, a switching operation of the transistor 11 with respect to the input signal $V_{in}$ is stabilized, so that the output current $I_{out}$ can be stabilized. Therefore, even if the bonding wires BW1 and BW2 are lengthened, the output current $I_{out}$ can be stabilized. As a result, it is possible to lengthen a distance between the light emitting element 2 and the driver circuit 3B while maintaining electrical characteristics (particularly, frequency characteristics).

In other words, the transistor 41 is provided so as to prevent the electromotive force E from biasing between the base and the collector of the transistor 11 in a forward direction. That is, the electromotive force E is suppressed by the transistor 41 such that the performance of the common emitter amplifier 10B does not change due to a transient voltage change. As a result, a state where a reverse bias is applied between the base and the collector of the transistor 11 is maintained.

The driver circuit 3B includes the capacitor 14 electrically connected between the base of the transistor 41 and the ground potential GND. Thus, the base of the transistor 41 is grounded on the high frequency side (in a high frequency range). For example, the switching of the transistor 11 not only increases or decreases the drive current $I_{LD}$ but also generates high-frequency noise in the driver circuit 3B. As the high-frequency noise flows to the ground potential GND via the capacitor 14, it is possible to stabilize the collector potential of the transistor 11. That is, the collector of the transistor 11 is electrically connected to the emitter of the transistor 41, and the emitter potential of the transistor 41 changes in accordance with the change in the base potential of the transistor 41. However, it is possible to suppress the influence of the high-frequency noise on the emitter potential of the transistor 41 by stabilizing the base potential of the transistor 41. Incidentally, the capacitor 14 may include a plurality of capacitors having mutually different electrostatic capacitance values.

In addition, the high-frequency component of the output current $I_{out}$ is bypassed not to flow to the light emitting element 2 by the filter circuit 20B. As a result, the filter circuit 20B allows the transition time of the drive current $I_{LD}$ to be adjusted. For example, it is possible to suppress the relaxation oscillation of the light emitting element 2 and to improve the waveform quality of the optical output signal $P_{out}$ by slowing the rise of the drive current $I_{LD}$.

In addition, the potential difference between the potential of the cathode of the light emitting element 2, which is increased above the ground potential GND by the level shift circuit 40, and the ground potential GND is set to be substantially equal to the potential difference between the potential of the constant voltage $V_{cas}$ and the emitter potential of the transistor 41. Thus, a voltage (drive voltage) between the anode and the cathode of the light emitting element 2 can be kept at a predetermined value.

When being compared with the driver circuit 203, the driver circuit 3B further includes the transistor 41 and the level shift circuit 40 (the transistor 43). Thus, the potential of the terminal T4 is increased by the transistors 41 and 43 by the amount corresponding to one transistor, that is, about the base-emitter voltage Vbe3. As a result, the power consumption inside the driver circuit 3B is greater than the power consumption inside the driver circuit 203 by Vbe3× $I_{out}$. Meanwhile, only the light emitting element 2 can be placed on the temperature control element by lengthening the bonding wires BW1 and BW2 in the optical transmitter 1B. Thus, the heat generated by the power consumption of the driver circuit 3B is not directly controlled by the temperature control element, and thus, the power consumption relating to the temperature control is less than that of the optical transmitter 201. In general, the decrease in power consumption of the temperature control is greater than the increase in power consumption of the driver circuit, and thus, the power consumption of the optical transmitter can be reduced as a whole.

Third Embodiment

Figure 17:
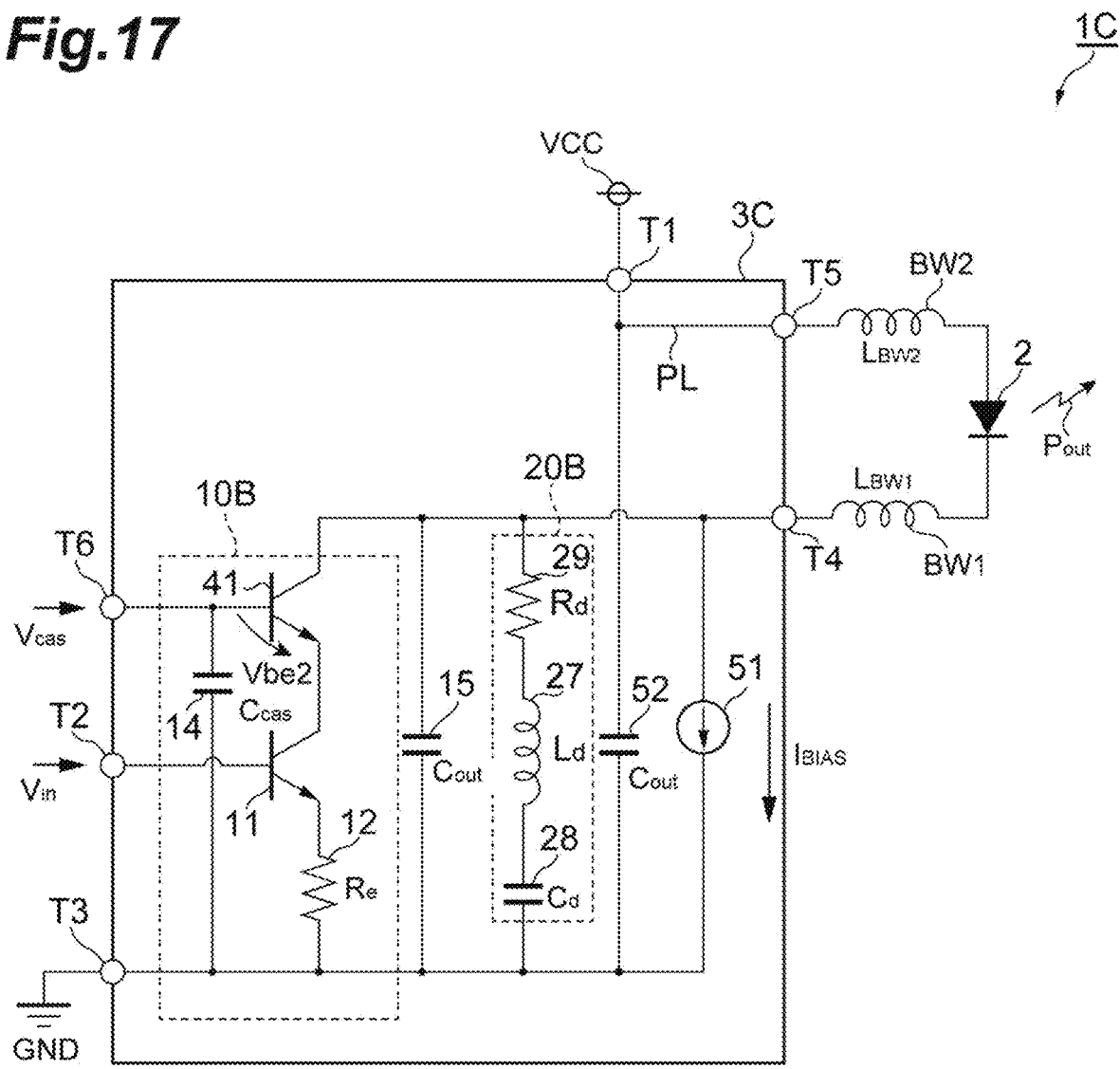
FIG. 17 is a diagram illustrating a schematic configuration of an optical transmitter including a driver circuit according to a third embodiment.

Next, a driver circuit according to a third embodiment will be described with reference to FIG. 17. FIG. 17 is a diagram illustrating a schematic configuration of an optical transmitter including a driver circuit according to a third embodiment. As illustrated in FIG. 17, an optical transmitter 1C is mainly different from the optical transmitter 1B in terms of including a driver circuit 3C in place of the driver circuit 3B, in terms of not including the bias current source 4 and the FBI 5, and in terms of connection between the light emitting element 2 and the driver circuit 3B. The driver circuit 3C is mainly different from the driver circuit 3B in terms of including a bias current source 51, a capacitor 52 (capacitive element), and a terminal T1 in place of the level shift circuit 40.

In the optical transmitter 1C, a cathode of a light emitting element 2 is connected to a terminal T4 via a bonding wire BW1, and an anode of the light emitting element 2 is connected to a terminal T5 via a bonding wire BW2. That is, the terminal T4 is electrically connected to the cathode of the light emitting element 2, and the terminal T5 is electrically connected to the anode of the light emitting element 2. The terminal T1 is electrically connected to a supply line VCC. The terminals T5 and T6 are electrically connected to each other via a supply wiring PL. The supply wiring PL is a wiring configured to supply a supply voltage to the anode of the light emitting element 2. Therefore, the anode of the light emitting element 2 is electrically connected to the supply voltage.

The bias current source 51 supplies a DC bias current $I_{BIAS}$ in a forward direction of the light emitting element 2 in order to cause the light emitting element 2 to emit light with predetermined power. One end of the bias current source 51 is electrically connected to the terminal T4, and the other end of the bias current source 51 is electrically connected to a terminal T3. Thus, a common emitter amplifier 10B increases or decreases a drive current $I_{LD}$ by superimposing (adding) an output current $I_{out}$ to the bias current $I_{BIAS}$ via the terminal T4.

One end of the capacitor 52 is electrically connected to the terminal T1, and the other end of the capacitor 52 is electrically connected to the terminal T3 via a ground line of the driver circuit 3C. That is, the capacitor 52 is electrically connected between the supply wiring PL and a ground potential GND and acts as a return path for the drive current $I_{LD}$.

In the driver circuit 3C configured as described above, the output current $I_{out}$ is generated in accordance with the input signal $V_{in}$ input to a base of a transistor 11, and the output current $I_{out}$ is superimposed on the bias current $I_{BIAS}$ via the terminal T4, whereby the drive current $I_{LD}$ flowing to the light emitting element 2 is increased or decreased.

The supply wiring PL and the anode of the light emitting element 2 are electrically connected via the bonding wire BW2, and the terminal T4 and the cathode of the light emitting element 2 are electrically connected via the bonding wire BW1. An electromotive force E is generated due to an inductance $L_{BW}$ of the bonding wires BW1 and BW2 in accordance with a change in the output current $I_{out}$. This electromotive force E is expressed by Formula (1).

A collector of a transistor 41 is electrically connected to the terminal T4 in the driver circuit 3C, and thus, the electromotive force E is applied to the collector of the transistor 41. However, a constant voltage $V_{cas}$ is applied to a base of the transistor 41, and thus, an emitter potential of the transistor 41 becomes a potential ($=V_{cas}-Vbe2$) obtained by subtracting a voltage Vbe2 between the base and the emitter of the transistor 41 from the constant voltage $V_{cas}$. Since the emitter of the transistor 41 and a collector of the transistor 11 are connected to each other, the collector of the transistor 11 also has the potential obtained by subtracting the base-emitter voltage Vbe2 of the transistor 41 from the constant voltage $V_{cas}$. Thus, the collector potential of the transistor 11 becomes substantially constant, and fluctuation of the collector potential of the transistor 11 caused by the electromotive force E can be suppressed.

The same effect as that of the driver circuit 3B is also obtained in the driver circuit 3C. That is, the collector of the transistor 11 and the emitter of the transistor 41 are electrically connected to each other in the common emitter amplifier 10B. The above-described electromotive force is applied to the collector of the transistor 41 since the collector of the transistor 41 is electrically connected to the terminal T4. However, the fluctuation of the emitter potential of the transistor 41 is suppressed since the constant voltage $V_{cas}$ is applied to the base of the transistor 41. As a result, the fluctuation of a collector potential of the transistor 11 is suppressed. A stray capacitance appears between the base and the collector of the transistor 11, and the stray capacitance fluctuates depending on the collector potential of the transistor 11. However, the fluctuation of the collector potential of the transistor 11 is suppressed, and thus, transmission of the potential fluctuation thereof to the base of the transistor 11 via the stray capacitance is suppressed. As a result, a switching operation of the transistor 11 with respect to the input signal $V_{in}$ is stabilized, so that the influence of the inductance $L_{BW}$ of the bonding wires BW1 and BW2 on the output current $I_{out}$ a can be mitigated. Therefore, even if the bonding wires BW1 and BW2 are lengthened, transitions of the output current $I_{out}$ can be stabilized. As a result, it is possible to lengthen a distance between the light emitting element 2 and the driver circuit 3B while maintaining electrical characteristics (for example, frequency characteristics).

The capacitor 52 is provided between the supply wiring PL and the ground potential GND. Thus, the capacitor 52 acts as the return path of the drive current $I_{LD}$, and it is possible to suppress a disturbance in the waveform of the drive current $I_{LD}$. The capacitor 52 may include a plurality of capacitors having mutually different electrostatic capacitance values.

In addition, since the level shift circuit 40 is not provided in the driver circuit 3C, it is possible to reduce power consumption as compared with the driver circuit 3B. For example, when a voltage of the supply line VCC is lowered by a voltage drop of the level shift circuit 40, the power consumption decreases.

Incidentally, the driver circuit according to the invention is not limited to the above embodiments.

For example, the description has been given using a bipolar transistor as each transistor in the above embodiments, but the transistor may be a field effect transistor (FET). When the transistor is the FET, the base, the emitter and the collector of the bipolar transistor can be replaced with a gate, a source, and a drain, respectively.

In addition, the level shift circuit 40 includes the diode-connected transistor 41 in the driver circuit 3B, but a Schottky diode or a PN-junction diode may be provided in place of the transistor 41. In addition, a capacitor may be provided in parallel with the level shift circuit 40. In this case, the high-frequency impedance is reduced.

What is claimed is:

1. A driver circuit configured to increase or decrease a drive current flowing to a light emitting element connected in series to a bias current source that supplies a bias current, in accordance with an input signal, the driver circuit comprising:
   an output terminal configured to be electrically connected between the bias current source and the light emitting element, and configured to draw an output current inward;
   a shunt circuit configured to generate a first current in accordance with the input signal; and
   a waveform shaping circuit configured to detect a rising transition of a voltage of the output terminal and generate a second current based at least in part on a result of detection,
   wherein the first current and the second current constitute the output current, wherein the first current increases when the input signal increases, and decreases when the input signal decreases, wherein the voltage of the output terminal rises when the output current decreases, wherein the shunt circuit has an output and a ground point, wherein the first current flows from the output toward the ground point, and wherein the waveform shaping circuit comprises:

a first transistor including a control terminal, a first current terminal electrically connected to the output of the shunt circuit, and a second current terminal electrically connected to the ground point of the shunt circuit, the second current terminal being configured to generate the second current in response to a voltage of the control terminal; and a first filter circuit including a capacitor provided between the output of the shunt circuit and the control terminal of the first transistor and a resistive element provided between the control terminal of the first transistor and the ground point of the shunt circuit.

2. The driver circuit according to claim 1, wherein the waveform shaping circuit further comprises a current source configured to supply a constant current to the resistive element for biasing the control terminal of the first transistor.

3. The driver circuit according to claim 1, wherein
the waveform shaping circuit includes a first common emitter amplifier including the first transistor,
the shunt circuit is a second common emitter amplifier including a second transistor, and
a gain of the first common emitter amplifier is set to be smaller than a gain of the second common emitter amplifier.

4. The driver circuit according to claim 1, further comprising a cascode transistor provided between the output of the shunt circuit and the capacitor.

5. The driver circuit according to claim 1, wherein the waveform shaping circuit shapes a waveform of the output current for a frequency range set based at least in part on a capacitance value of the capacitor and a resistance value of the resistive element included in the first filter circuit.

6. The driver circuit according to claim 1, further comprising a second filter circuit configured to be connected in parallel with the light emitting element.

7. A driver circuit configured to increase or decrease a drive current flowing to a light emitting element connected in series to a bias current source that supplies a bias current, in accordance with an input signal, the driver circuit comprising:

an input terminal to which the input signal is input;

an output terminal configured to be electrically connected between the bias current source and an anode of the light emitting element;

a common emitter amplifier configured to increase or decrease the drive current by generating an output current in accordance with the input signal and drawing the output current from the bias current via the output terminal; and a level shift circuit electrically connected between a cathode of the light emitting element and ground, the level shift circuit being configured to increase a potential of the cathode from ground, wherein the common emitter amplifier comprises:

a resistive element;

a first transistor including a base electrically connected to the input terminal, a collector, and an emitter electrically connected to ground via the resistive element; and a second transistor including a base to which a constant voltage is applied, collector electrically connected to the output terminal, and an emitter electrically connected to the collector of the first transistor.

8. The driver circuit according to claim 7, further comprising a capacitive element electrically connected between the base of the second transistor and ground.

9. The driver circuit according to claim 7, further comprising a filter circuit electrically connected between the collector of the second transistor and ground.

10. The driver circuit according to claim 7, wherein the level shift circuit allows a potential difference between the potential of the cathode and ground to be substantially equal to a potential difference between a potential of the constant voltage and a potential of the emitter of the second transistor.

11. A driver circuit configured to increase or decrease a drive current flowing to a light emitting element connected in series to a bias current source that supplies a bias current, in accordance with an input signal, the driver circuit comprising:

an input terminal configured to receive the input signal;

a supply wiring configured to supply a supply voltage to an anode of the light emitting element;

an output terminal configured to be electrically connected to a cathode of the light emitting element; and common emitter amplifier configured to increase or decrease the drive current by generating an output current in accordance with the input signal and superimposing the output current on the bias current via the output terminal, wherein the bias current source is electrically connected to the cathode of the light emitting element through the output terminal, wherein the common emitter amplifier comprises:

a resistive element;

a first transistor including a base electrically connected to the input terminal, a collector, and an emitter electrically connected to ground via the resistive element; and a second transistor including a base to which a constant voltage is applied, collector electrically connected to the output terminal, and an emitter electrically connected to the collector of the first transistor, and wherein the drive current increases when the output current increases, and the drive current decreases when the output current decreases.

12. The driver circuit according to claim 11, further comprising a capacitive element electrically connected between the supply wiring and ground.

* * * * *